(12) United States Patent
Lee

(10) Patent No.: US 10,957,411 B2
(45) Date of Patent: Mar. 23, 2021

(54) APPARATUS AND METHOD FOR MANAGING VALID DATA IN MEMORY SYSTEM

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/519,936

(22) Filed: Jul. 23, 2019

(65) Prior Publication Data

US 2020/0082891 A1    Mar. 12, 2020

(30) Foreign Application Priority Data

Sep. 12, 2018   (KR) .................. 10-2018-0108839

(51) Int. Cl.
| | | |
|---|---|---|
| *G11C 16/16* | (2006.01) | |
| *G11C 16/34* | (2006.01) | |
| *G06F 12/02* | (2006.01) | |
| *G11C 16/26* | (2006.01) | |

(52) U.S. Cl.
CPC ...... *G11C 16/3445* (2013.01); *G06F 12/0246* (2013.01); *G11C 16/16* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 8,300,477 | B2* | 10/2012 | Haukness | G11C 16/16 |
| | | | | 365/185.29 |
| 9,229,805 | B2* | 1/2016 | Yim | G06F 11/1658 |
| 9,361,201 | B2* | 6/2016 | Masuo | G11C 16/3495 |
| 9,679,658 | B2* | 6/2017 | Pelster | G11C 16/26 |
| 10,108,354 | B2* | 10/2018 | Lee | G06F 11/00 |
| 2010/0049907 | A1* | 2/2010 | Kitsunai | G06F 3/0619 |
| | | | | 711/103 |
| 2017/0344295 | A1* | 11/2017 | Sheffi | G11C 11/5635 |

FOREIGN PATENT DOCUMENTS

| | | |
|---|---|---|
| KR | 10-2011-0036816 | 4/2011 |
| KR | 10-2011-0065759 | 6/2011 |
| KR | 10-2011-0097084 | 8/2011 |
| KR | 10-2014-0020634 | 2/2014 |

* cited by examiner

*Primary Examiner* — Elias Mamo
(74) *Attorney, Agent, or Firm* — IP & T Group LLP

(57) ABSTRACT

A memory system includes a memory device including a plurality of blocks, each capable of storing data, and a controller, coupled with the memory device. The controller can perform at least one sub erase operation on each of the plurality of blocks, and variably increase an erase count of each of the plurality of blocks based on a timing of erasing data of each of the plurality of blocks through the sub erase operation.

15 Claims, 19 Drawing Sheets

<TB_A>

| BLOCK | EC |
|---|---|
| BLK1 | 9 |
| BLK2 | 6 |
| BLK3 | 3 |
| ⋮ | ⋮ |
| BLK(n-1) | 7 |
| BLKn | 5 |

<TB_B>

| BLOCK | EC |
|---|---|
| BLK1 | 9.9 |
| BLK2 | 7.2 |
| BLK3 | 3.1 |
| ⋮ | ⋮ |
| BLK(n-1) | 7.0 |
| BLKn | 5.5 |

<TB_C>

| BLOCK | EC | F/N |
|---|---|---|
| BLK1 | 42 | F |
| BLK2 | 23 | N |
| BLK3 | 19 | F |
| ⋮ | ⋮ | ⋮ |
| BLK(n-1) | 7 | N |
| BLKn | 12 | F |

APPARATUS AND METHOD FOR MANAGING VALID DATA IN MEMORY SYSTEM

CROSS-REFERENCE TO RELATED APPLICATION

This patent application claims priority to Korean Patent Application No. 10-2018-0108839, filed on Sep. 12, 2018, the entire disclosure of which is incorporated herein by reference.

TECHNICAL FIELD

Various embodiments of the disclosure generally relate to a memory system. Particularly, the embodiments relate to an apparatus and a method for determining an erase count regarding a memory block of a nonvolatile memory device.

BACKGROUND

Recently, the computer environment paradigm has shifted to ubiquitous computing, which enables a computer system to be used anytime and everywhere. As a result, the use of portable electronic devices such as mobile phones, digital cameras, notebook computers and the like have been rapidly increasing. Such portable electronic devices typically use or include a memory system that uses at least one memory device, i.e., a data storage device. The data storage device can be used as a main storage device or an auxiliary storage device of a portable electronic device.

Unlike characteristics of a hard disk, a data storage device using a nonvolatile memory device has advantages such as excellent stability and durability, because it has no mechanical driving part (e.g., a mechanical arm), and has high data access speed and low power consumption. As an example of a memory system having such advantages, a data storage device includes a universal serial bus (USB) memory device, a memory card having various interfaces, a solid state drive (SSD) or the like.

SUMMARY

Embodiments of the invention provide a memory system, a data processing system, and an operation process or a method, capable of quickly and reliably processing data for a memory device by reducing operational complexity and performance degradation of the memory system and enhancing usage efficiency of the memory device.

The disclosure provides a method and an apparatus capable of measuring or managing an operational status (e.g., healthy, lifetime) of each memory block. The method and the apparatus may variably determine how much an erase count is increased based on the number of sub erase operations, or the time consumed for erasing data in the memory block, after erasing the data in the memory block of the memory device.

Further, the disclosure provides a method and an apparatus for improving efficiency and stability of a memory device through wear levelling or garbage collection to which an erase count is applicable. The erase count may reflect a more accurate operation status regarding each of plural memory blocks which are capable of storing data in the memory device.

In an embodiment, a memory system can include a memory device including a plurality of blocks; and a controller, coupled with the memory device, suitable for performing at least one sub erase operation on each of the plurality of blocks, and variably increase an erase count of each of the plurality of blocks based on a timing of erasing data of each of the plurality of blocks through the sub erase operation.

The sub erase operation may be associated with each of plural erase pulses generated in response to an erase command. The controller can erase data stored in a corresponding block based on at least one of the plurality of erase pulses.

The controller may variably increase the erase count regarding the corresponding block based on a number of sub erase operations performed after an initial sub erase operation is performed before the data of the corresponding block is erased. By way of example but not limitation, the controller can increase the erase count by one of: a first value when the number of sub erase operations is equal to a threshold; a second value less than the first value when the number of sub erase operation is less than the threshold; and a third value greater than the first value when the number of sub erase operations is greater than the threshold.

The controller can variably increase the erase count regarding the corresponding block based on a time interval between a first timing of beginning an initial sub erase operation and a second timing of completely erasing the data of the corresponding block. By way of example but not limitation, the controller can increase the erase count by one of: a first value when the time interval is equal to a threshold; a second value less than the first value when the time interval is less than the threshold; and a third value greater than the first value when the time interval is greater than the threshold.

The controller can verify whether the data of the corresponding block is erased whenever each sub erase operation is done.

The controller may verify whether the data of the corresponding block is erased before the sub erase operation is initially performed.

The controller can maintain the erase count of the corresponding block when no sub erase operation is performed in the corresponding block. The controller may allocate the corresponding block for another operation when the erase count of the corresponding block is less than that of other blocks among the plurality of blocks.

In another embodiment, an apparatus can control a nonvolatile memory device including a plurality of blocks. The apparatus can include an erase operation control circuitry suitable for performing at least one sub erase operation on each of the plurality of blocks, and variably increasing an erase count of each of the plurality of blocks based on a timing of erasing data of each of the plurality of blocks through the sub erase operation; and a program control circuitry for allocating a block among the plurality of blocks for programming when the erase count of the block is less than that of other blocks among the plurality of blocks.

In another embodiment, a method for operating a memory system can include performing at least one sub erase operation on each of the plurality of blocks; determining whether data of each of the plurality of blocks is erased; and variably increasing an erase count of each of the plurality of blocks based on a timing of erasing data of each of the plurality of blocks through the sub erase operation.

The performing of the sub erase operation can include erasing data stored in a corresponding block based on the sub erase operation, each associated with a plurality of erase pulses generated in response to an erase command.

The variably increasing of the erase count can include variably increasing the erase count regarding the corresponding block based on a number of sub erase operations performed after an initial sub erase operation is performed before the data of the corresponding block is erased. By way of example but not limitation, the erase count may be increased by one of: a first value when the number of sub erase operation is equal to a threshold; a second value less than the first value when the number of sub erase operations is less than the threshold; and a third value greater than the first value when the number of sub erase operations is greater than the threshold.

The variably increasing of the erase count can include variably increasing the erase count regarding the corresponding block based on a time interval between a first timing of beginning an initial sub erase operation and a second timing of completely erasing the data of the corresponding block. By way of example but not limitation, the erase count can be increased by one of: a first value when the time interval is equal to a threshold; a second value less than the first value when the time interval is less than the threshold; and a third value greater than the first value when the time interval is greater than the threshold.

The method can further include verifying whether the data of the corresponding block is erased before the sub erase operation is initially performed.

The variably increasing of the erase count can include maintaining the erase count of the corresponding block when no sub erase operation is performed in the corresponding block.

The method can further include allocating the corresponding block for another operation first when the erase count of the corresponding block is less than that of other blocks among the plurality of blocks.

In another embodiment, a memory system can include a memory device including a plurality of blocks; and a controller configured to perform a plurality of sub erase operations on each of the plurality of blocks; increase an erase count value for each of the plurality of blocks based on the number of the plurality of sub erase operations performed therein; and select a block with a lowest erase count value among the plurality of blocks for a program operation.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
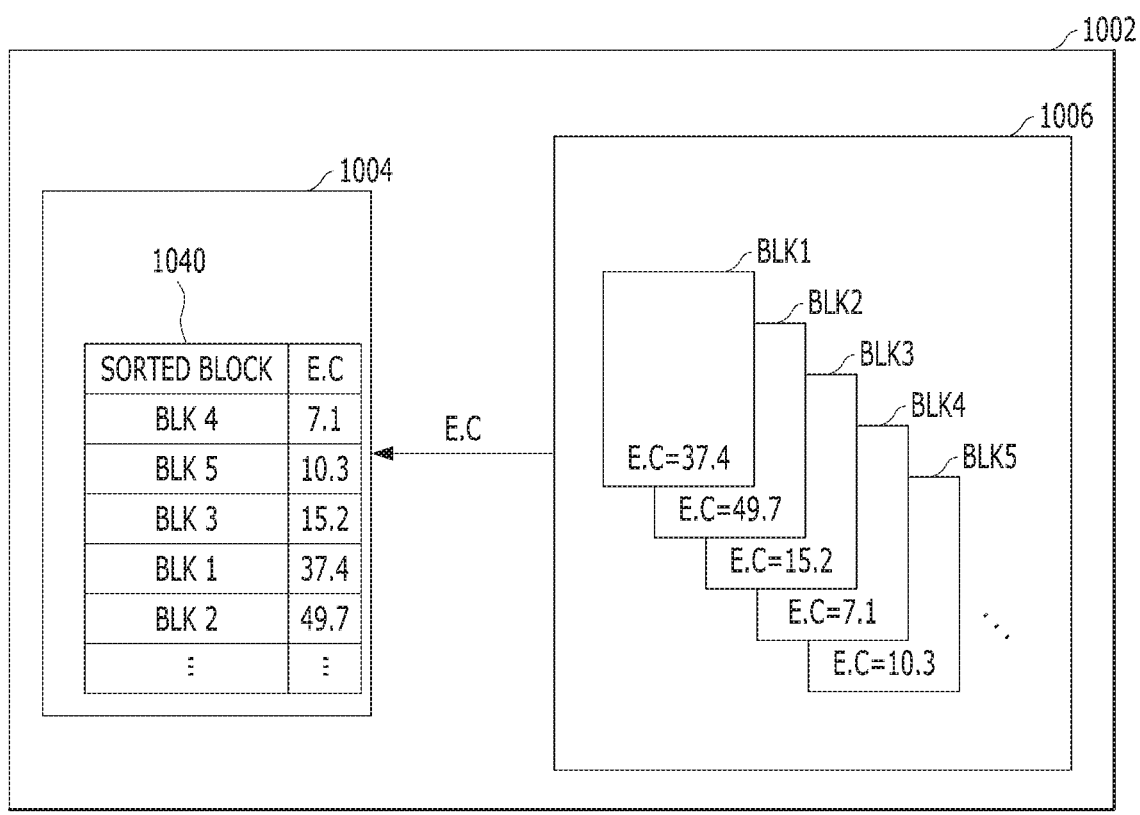
FIG. 1 is a diagram illustrating a memory system in accordance with an embodiment of the disclosure.

Various examples of the disclosure are described below in more detail with reference to the accompanying drawings. The disclosure may be embodied in other embodiments, forms and variations thereof and should not be construed as being limited to the embodiments set forth herein. Rather, the described embodiments are provided so that this disclosure is thorough and complete and will fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element that otherwise have the same or similar names. Thus, a first element in one instance may be referred to as a second or third element in another instance without departing from the spirit and scope of the invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements. Communication between two elements, whether directly or indirectly connected/coupled, may be wired or wireless, unless the context indicates otherwise. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention.

As used herein, singular forms are intended to include the plural forms and vice versa, unless the context clearly indicates otherwise. The articles 'a' and 'an' as used in this application and the appended claims should generally be construed to mean 'one or more' unless specified otherwise or it is clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the disclosure and the relevant art, and will not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure will be described in detail with reference to the accompanied drawings.

FIG. 1 illustrates a memory system 1002 in accordance with an embodiment of the disclosure. Referring to FIG. 1, the memory system 1002 may include a controller 1004 and a memory device 1006. The controller 1004 may generate a priority block list 1040 in which free blocks are aligned in ascending order of erase count (EC or E.C) regarding each of blocks in the memory device 1006. In addition, the controller 1004 may store the priority block list 1040 in a memory (e.g., a memory 144 of FIG. 2) within the controller 1004. For example, the priority block list 1040 may be generated by the controller 1004 and stored in a memory of the controller 1004.

The memory device 1006 may include a plurality of blocks including blocks BLK1, BLK2, BLK3, BLK4 and BLK5, each capable of storing data. Erase counts are respectively corresponding to each of the plurality of blocks. For example, the first block BLK1 has an erase count of 37.4, the second block BLK2 has an erase count of 49.7, the third block BLK3 has an erase count of 15.2, the fourth block BLK4 has an erase count of 7.1, and the fifth block BLK5 has an erase count of 10.3. Each erase count may be stored in the corresponding block or may be stored in a separate specific block.

The page storing data in the memory device 1006 may be identified by a physical address. By way of example but not limitation, by using address information indicating a first page pg0 of a first block BLK1, location where data is stored in the memory device 1006 may be specified. The memory system 1002 may recognize address information regarding pages in which data is stored, but a host (e.g., a host 102 shown in FIGS. 2 to 3) engaged with the memory system 1002 may not recognize the address information like the physical address used in the memory system 1002.

A host may manage data generated by itself or inputted from a user, using its own address system. Here, the address system used by the host may be referred to as a logical address. Because the host wants to use a logical address for reading or writing data, the memory system 1002 needs to translate a logical address of the host into a physical address of the memory system 1002. The controller 1004 may include an address translation function.

For operational efficiency, the controller 1004 may generate or manage first address information for translating a logical address into a physical address, and second address information for translating a physical address to a logical address. The first address information and the second address information may be stored in the memory device 1006. For example, the memory device 1006 may include a map table (not shown) including plural pieces of map data (e.g., BLK1 P2L Data, BLK2 P2L Data, BLK3 P2L. Data) corresponding to each data stored in the plurality of blocks (e.g., BLK1, BLK2, BLK3).

The controller 1004 may load all or parts of the first address information and the second address information, and store the same at a memory inside the controller 1004. In accordance with an embodiment, the controller 1004 may update or manage changed values after loading the map table 1020 in a space (e.g., an internal memory) of the controller 1004. The updated map table 1020 may be stored in the memory device 1006. When the last updated map table 1020 is stored in the memory device 1006, the previous map data of the memory device 1006 may not be used furthermore.

The controller 1004 may include a block list 1102, like map data loaded from the memory device 1006.

The controller 1004 may generate the block list 1102 based on operation information or status information regarding a plurality of blocks of the memory device 1006. Here, the operation information or the state information may include a valid page count (VPC) of each of a plurality of blocks in the memory device 1006.

The controller 1004 may recognize a change of valid page count (VPC) before and after the update of the map data regarding each block in the memory device 1006. The controller 1004 may generate the block list 1102 based on the change of valid page count CH_VPC regarding each block. Further, the controller 1004 may arrange or sort items regarding each block of the block list 1102 in an order of change of valid page count. In accordance with an embodiment, the controller 1004 may generate the block list 1102 regarding all or a part of the plurality of blocks in the memory device 1006. For example, the block list 1102 may include a block in which data has been lastly accessed, the latest program operation has been performed, or map data of the data stored therein has been updated. When a block storing plural data is not accessed for a long time, that block might be not included in the block list 1102.

The erase count for each of a plurality of blocks may not be directly proportional to the number of erase operations for the corresponding block. For example, when the erase operation is performed ten times in the first block BLK1 and the erase operation is performed eight times in the second block BLK2, the erase count for the first block BLK1 might be not greater than that of the second block BLK2. In a conventional case, if the erase operation is performed once in a certain block, an erase count regarding the certain block may always be increased by the same value. However, in an embodiment of the disclosure, the increment of erase count regarding a certain block may vary whenever a single erase operation is performed in the certain block.

The controller 1004 may access erase counts regarding a predetermined range of free blocks in the memory device 1006 to generate a priority block list 1040. The priority block list 1040 may be stored in a memory space within the controller 1004. The priority block list 1040 may list some free blocks in an ascending order of erase count.

In an embodiment of the disclosure, the first block BLK1, the second block BLK2, the third block BLK3, the fourth block BLK4 and the fifth block BLK5, as shown in FIG. 1, may be considered a free block. Blocks not shown are non-free blocks or a block whose erase count is 50 or more. The controller 1004 may access erase counts regarding free blocks of the memory device 1006. Further, the controller 1004 may use the erase counts to sort or arrange the free block in an order (e.g., ascending order) of an erase count, such as the priority block list 1040. As a result, the fourth block BLK4, the fifth block BLK5, the third block BLK3, the first block BLK1 and the second block BLK2 may be listed in the ascending order. The erase counts for the blocks BLK1, BLK2, BLK3, BLK4, BLK5 are 7.1, 10.3, 15.2, 37.4 and 49.7, respectively. The priority block list 1040 is stored in a memory of the controller 1004. When the controller 1004 selects a free block for handling a program or write command received from a host, the priority block list 1040 may be used for selecting a free block.

For example, a free block may be used when it is necessary to store large amount of data received from a host, or to move data for operations such as wear leveling or garbage collection. At this time, the controller 1004 may preferentially select and use the free blocks in the order listed in the priority block list 1040.

Figure 2:
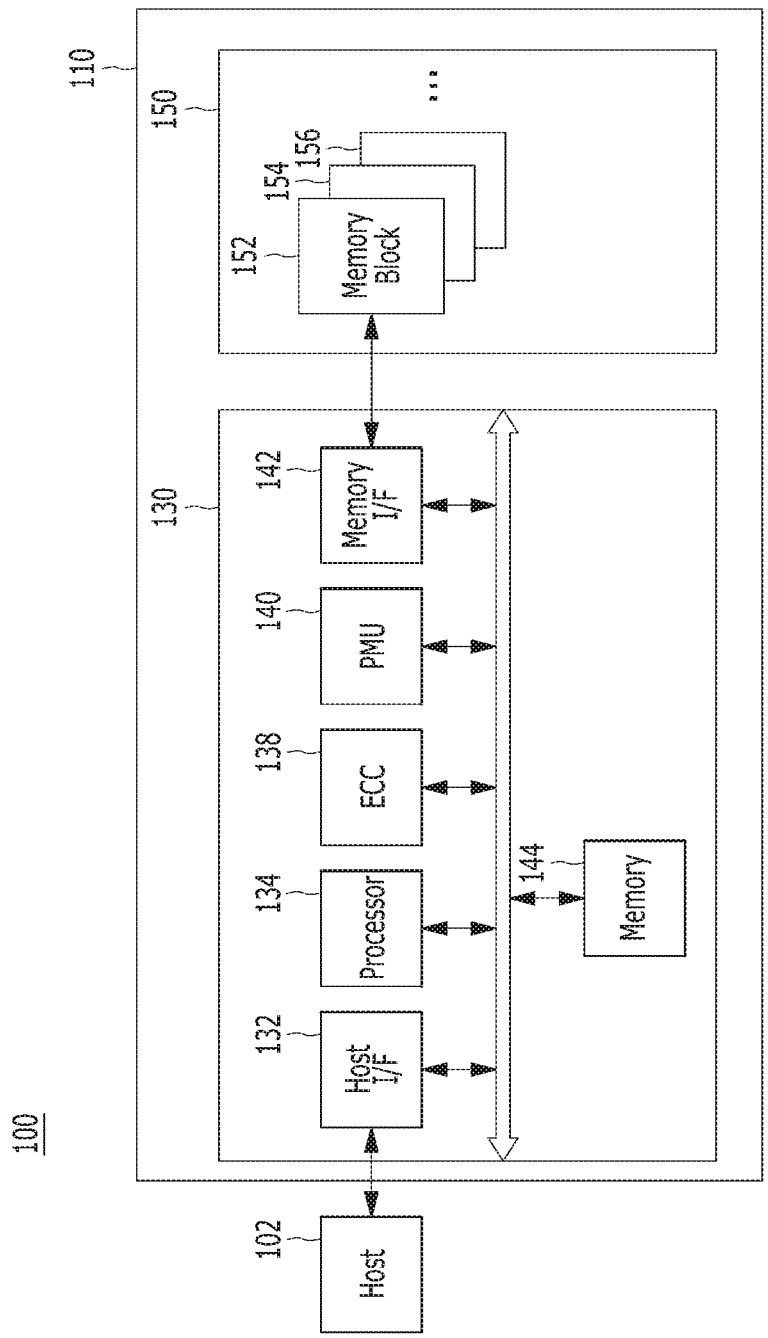
FIG. 2 is a block diagram illustrating a data processing system including a memory system in accordance with an embodiment of the disclosure.

FIG. 2 illustrates a data processing system 100 in accordance with an embodiment of the disclosure. Referring to FIG. 2, the data processing system 100 may include a host 102 engaged or interlocked with a memory system 110.

The host 102 may include a portable electronic device such as a mobile phone, an MP3 player and a laptop computer or an electronic device such as a desktop computer, a game player, a television (TV), a projector and the like.

The host 102 includes at least one operating system (OS), which can generally manage, and control, functions and operations performed in the host 102. The OS can provide interoperability between the host 102 engaged with the memory system 110 and the user needing and using the memory system 110. The OS may support functions and operations corresponding to user's requests. By way of example but not limitation, the OS can be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. The enterprise operating systems can be specialized for securing and supporting high performance, including Windows servers, Linux, Unix and the like. Further, the mobile operating system may include an Android, an iOS, a Windows mobile and the like. The mobile operating system may be subject to support services or functions for mobility (e.g., a power saving function). The host 102 may include a plurality of operating systems. The host 102 may execute multiple operating systems interlocked with the memory system 110, corresponding to user's request. The host 102 may transmit a plurality of commands corresponding to user's requests into the memory system 110, thereby performing operations corresponding to commands within the memory system 110. Handling plural commands in the memory system 110 is described later, referring to FIGS. 4 and 5.

The memory system 110 may operate or perform a specific function or operation in response to a request from the host 102. Particularly, the memory system 110 may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102. The controller 130 may control storage of data in the memory device 150. Herein, the memory device 150 shown in FIG. 2 can correspond to the memory device 1006 shown in FIG. 1, while the controller 130 shown in FIG. 2 can correspond to the controller 1004 shown in FIG. 1

The controller 130 and the memory device 150 may be integrated into a single semiconductor device, which may be included in the various types of memory systems as exemplified above.

By way of example but not limitation, the controller 130 and the memory device 150 may be integrated into a single semiconductor device. The controller 130 and memory device 150 configuring an SSD may be integrated into a single semiconductor device, for improving an operation speed. When the memory system 110 is used as an SSD, the operating speed of the host 102 connected to the memory system 110 can be more improved than that of the host 102 implemented with a hard disk. In addition, the controller 130 and the memory device 150 integrated into one semiconductor device may form a memory card. For example, a personal computer (PC) card (PCMCIA), a compact flash card (CF), a memory card such as a smart media card (e.g., SM, SMC), a memory sticks, a multimedia card (e.g., MMC, RS-MMC, MMCmicro), a secure digital (SD) card (e.g., SD, miniSD, microSD, SDHC), a universal flash memory and the like.

The memory system 110 may be configured as a part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even when electrical power is not supplied. The memory device 150 may store data provided from the host 102 through a write operation, while providing data stored therein to the host 102 through a read operation. The memory device 150 may include a plurality of memory blocks 152, 154, 156. Each of the memory blocks 152, 154, 156 may include a plurality of pages. Each of the plurality of pages may include a plurality of memory cells to which a plurality of word lines (WL) are electrically coupled. The memory device 150 also includes a plurality of memory dies including a plurality of planes, each of which includes a plurality of memory blocks 152, 154, 156. In addition, the memory device 150 may be a non-volatile memory device, for example a flash memory, wherein the flash memory may be a three-dimensional stack structure.

The controller 130 may control overall operations of the memory device 150, such as read, write, program, and erase operations. For example, the controller 130 may control the memory device 150 in response to a request from the host 102. The controller 130 may provide the data, read from the memory device 150, to the host 102. The controller 130 may store the data, provided by the host 102, into the memory device 150.

The controller 130 may include a host interface (I/F) 132, a processor 134, an error correction code (ECC) circuit 138, a power management unit (PMU) 140, a memory interface (I/F) 142 and a memory 144, all operatively coupled via an internal bus.

The host interface 132 may process commands and data provided from the host 102. The host interface 132 may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATH), small computer system interface (SCSI), enhanced small disk interface (ESDI) and integrated drive electronics (IDE). In accordance with an embodiment, the host interface 132 is a component for exchanging data with the host 102, which may be implemented through a firmware called a host interface layer (HIL).

The ECC circuit 138 may correct error bits of the data to be processed in (e.g., outputted from) the memory device 150. The ECC circuit 138 may include an ECC encoder and an ECC decoder. The ECC encoder may perform error correction encoding of data to be programmed in the memory device 150 to generate encoded data into which a parity bit is added, and store the encoded data in memory device 150. The ECC decoder may detect and correct errors contained in a data read from the memory device 150 when the controller 130 reads the data stored in the memory device 150. In other words, after performing error correction decoding on the data read from the memory device 150, the ECC circuit 138 may determine whether the error correction decoding has succeeded and output an instruction signal (e.g., a correction success signal or a correction fail signal). The ECC circuit 138 may use the parity bit which is generated during the ECC encoding process, for correcting the error bit of the read data. When the number of the error bits is greater than or equal to a threshold number of correctable error bits, the ECC circuit 138 may not correct error bits but may output an error correction fail signal indicating failure in correcting the error bits.

The ECC circuit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC circuit 138 may include all or some of the circuits, modules, systems or devices for performing the error correction operation based on at least one of the above described codes.

The PMU 140 may manage an electrical power provided in the controller 130.

The memory interface 142 may serve as an interface for handling commands and data transferred between the controller 130 and the memory device 150, to allow the controller 130 to control the memory device 150 in response to a request received from the host 102. The memory interface 142 may generate a control signal for the memory device 150 and may process data transmitted to the memory device 150 or received from the memory device 150 under the control of the processor 134 in a case when the memory device 150 is a flash memory (e.g., a NAND flash memory). The memory interface 142 may provide an interface for handling commands and data between the controller 130 and the memory device 150, for example, operations of NAND flash interface, in particular, operations between the controller 130 and the memory device 150. In accordance with an embodiment, the memory interface 142 may be implemented through firmware called a flash interface layer (FR) as a component for exchanging data with the memory device 150.

The memory 144 may support operations performed by the memory system 110 and the controller 130. The memory 144 may store temporary or transactional data which occur or are delivered for operations of the memory system 110 and the controller 130. The controller 130 may control the memory device 150 in response to a request from the host 102. The controller 130 may deliver data read from the memory device 150 into the host 102. The controller 130 may store data entered through the host 102 in the memory device 150. The memory 144 may be used to store data required for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 1 exemplifies the memory 144 disposed within the controller 130, the embodiment is not limited thereto. That is, the memory 144 may be located inside or outside the controller 130. For instance, the memory 144 may be embodied by an external volatile memory having a memory interface transferring data and/or signals transferred between the memory 144 and the controller 130.

The memory 144 may store data necessary for performing operations such as a program operation and a read operation, which are requested by the host 102. Further, the memory 144 may transfer data between the memory device 150 and the controller 130 for background operations such as garbage collection, and wear levelling. In accordance with an embodiment, for supporting operations of the memory system 110, the memory 144 may include a program memory, a data memory, a write buffer/cache, a read buffer/cache, a data buffer/cache, a map buffer/cache, and the like.

The processor 134 may be implemented with a microprocessor or a central processing unit (CPU). The memory system 110 may include one or more processors 134. The processor 134 may control the overall operations of the memory system 110. By way of example but not limitation, the processor 134 may control a program operation or a read operation of the memory device 150, in response to a write request or a read request from the host 102. In accordance with an embodiment, the processor 134 may use or execute firmware to control the overall operations of the memory system 110. Herein, the firmware may be referred to as a flash translation layer (FTL). The FTL may perform an operation as an interface between the host 102 and the memory device 150. The host 102 may transmit requests for write and read operations to the memory device 150 through the FTL.

The L may manage operations of address mapping, garbage collection, wear leveling and so forth. Particularly, the FTL may load, generate, update, or store map data. Therefore, the controller 130 may map a logical address, which is received from the host 102, with a physical address of the memory device 150 through the map data. The memory device 150 may perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the previous particular page to the another newly programed page) due to a characteristic of a flash memory device. Further, the controller 130 may store map data of the new data into the FTL.

The controller 130 may perform an operation requested from the host 102 in the memory device 150, using the processor 134 implemented in a microprocessor or central processing unit (CPU) or the like. The processor 134 may be engaged with the memory device 150 and may handle instructions or commands corresponding to a command received from the host 102. The controller 130 may perform a foreground operation as a command operation, corresponding to an command received from the host 102, such as a program operation corresponding to a write command, a read operation corresponding to a read command, an erase/discard operation corresponding to an erase/discard command, and a parameter set operation corresponding to a set parameter command or a set feature command with a set command.

The controller 130 may perform a background operation on the memory device 150 through the processor 134. By way of example but not limitation, the background operation includes an operation (e.g., a garbage collection (GC) operation) for copying and storing data stored in an arbitrary memory block among the memory blocks 152, 154, 156 in the memory device 150 to another arbitrary memory block. The background operation may include an operation (e.g., a wear leveling (WL) operation) to move or swap data stored in at least one of the memory blocks 152, 154, 156 in memory device 150 to at least another of the memory blocks 152, 154, 156. The background operation may include an operation for storing the map data stored in the controller 130 to at least one of the memory blocks 152, 154, 156 in the memory device 150, e.g., a map flush operation. The background operation may include a bad block management operation for checking bad blocks in the plurality of memory blocks 152, 154, 156 in the memory device 150.

The controller 130 performs a plurality of command operations corresponding to a plurality of commands from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 may determine, which channel or way in a plurality of channels (or ways), to use for connecting the controller 130 to a plurality of memory dies in the memory 150 is proper or appropriate for performing each operation. The controller 130 may send or transmit data or instructions via determined channels or ways for performing each operation. The plurality of memory dies in the memory 150 may transmit an operation result via the same channels or ways, respectively, after each operation is complete. Then, the controller 130 may transmit a response or an acknowledge signal to the host 102. In an embodiment, the controller 130 may check a status of each channel or each way. In response to a command from the host 102, the controller 130 may select at least one channel or way based on the status of each channel or each way so that instructions and/or operation results with data may be delivered via the selected channel(s) or way(s).

By way of example but not limitation, the controller 130 may recognize statuses regarding a plurality of channels (or ways) associated with a plurality of memory dies in the memory device 150. The controller 130 may determine each channel or each way as one of a busy state, a ready state, an active state, an idle state, a normal state, and/or an abnormal state. The determination of the controller 130 may be associated with a physical block address. The controller 130 may refer to descriptors from the memory device 150. The descriptors may include parameters that describe something about the memory device 150, which is data with a predetermined format or structure. For instance, the descriptors may include device descriptors, configuration descriptors, unit descriptors, and the like. The controller 130 may refer to, or use, the descriptors to determine which channel(s) or way(s) an instruction or data is exchanged via.

A management unit (not shown) may be included in the processor 134. The management unit may perform bad block management of the memory device 150. The management unit may find bad memory blocks in the memory device 150, which are in unsatisfactory condition for further use. Further, the management unit may perform bad block management on the bad memory blocks. When the memory device 150 is a flash memory (for example, a NAND flash memory), a program failure may occur during the write operation (or the program operation), due to characteristics of a NAND logic function. During the bad block management, the data of the program-failed memory block or the bad memory block may be programmed into a new memory block. The bad blocks may seriously aggravate the utilization efficiency of the memory device 150 having a three-dimensional (3D) structure and the reliability of the memory system 110. Thus, reliable bad block management may enhance or improve performance of the memory system 110.

Figure 3:
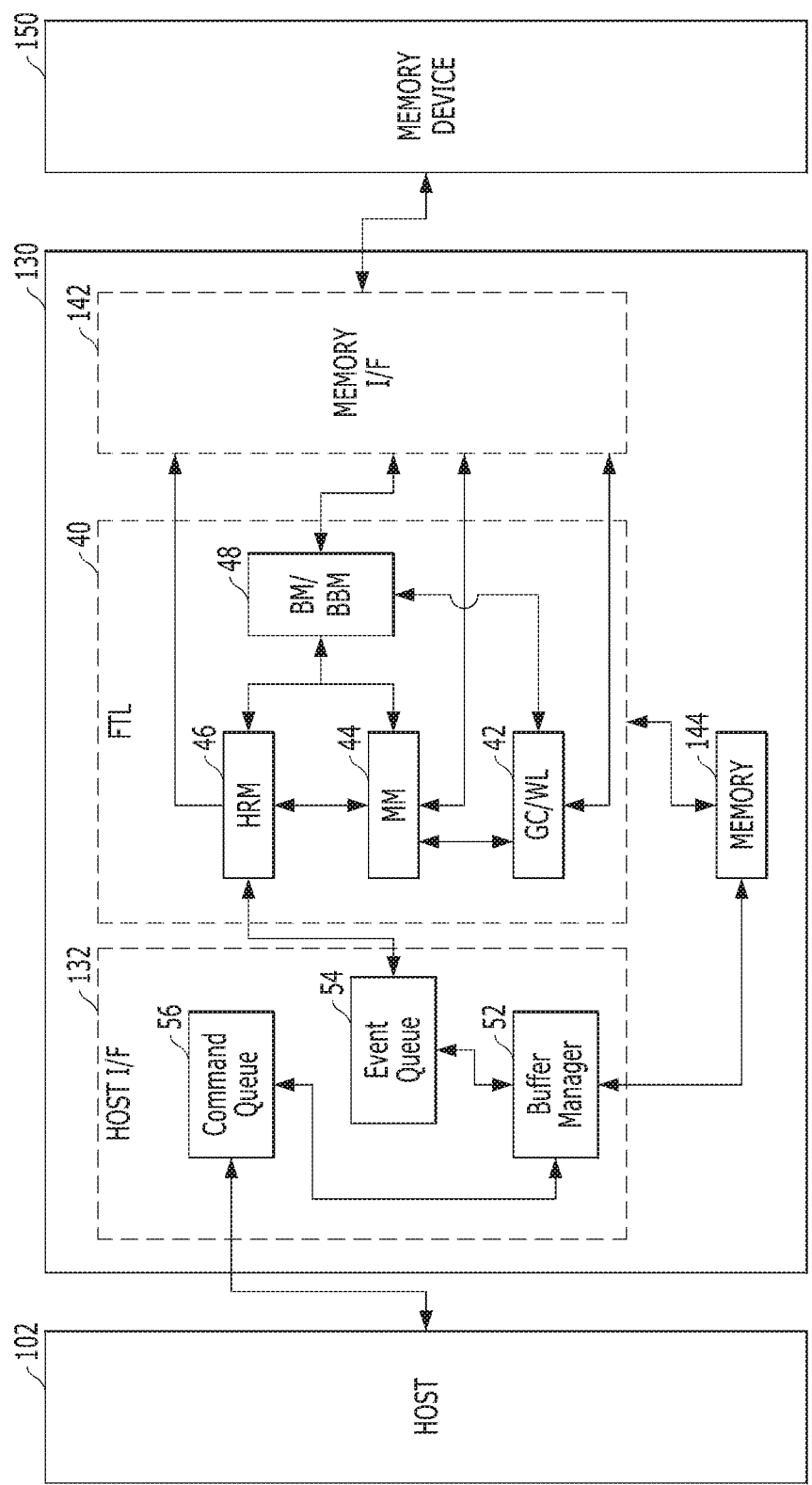
FIG. 3 is a diagram illustrating a controller in a memory system in accordance with an embodiment of the disclosure.

FIG. 3 illustrates a controller in a memory system in accordance with an embodiment of the disclosure. Referring to FIG. 3, the controller 130 cooperates with the host 102 and the memory device 150. The controller 130 may include a host interface 132, a flash translation layer (FTL) 40, a memory interface 142 and a memory 144.

Although not shown in FIG. 3, the ECC circuit 138 in FIG. 2 may be included in the flash translation layer 40. In another embodiment, the ECC circuit 138 may be implemented as a separate module, a circuit, or firmware, which is included in the controller 130.

The host interface 132 may handle commands, and data, received from the host 102. By way of example but not limitation, the host interface 132 may include a buffer manager 52, an event queue 54 and a command queue 56. The command queue 56 may sequentially store commands and data, received from the host 102, and output the commands and the data to the buffer manager 52 in a stored order. The buffer manager 52 may classify, manage or adjust the commands and the data, which are delivered from the command queue 56. The event queue 54 may sequentially transmit events for processing the commands and the data, received from the buffer manager 52.

A plurality of commands or data having the same characteristic may be continuously received from the host 102. Alternatively, a plurality of commands and data having different characteristics may be received from the host 102 after being mixed or jumbled. For example, a plurality of commands for reading data (i.e., read commands) may be delivered, or commands for reading data (i.e., read command) and programming/writing data (i.e., write command) may be alternately transmitted to the memory system 110. The host interface 132 may store commands and data, which are received from the host 102, to the command queue 56 sequentially. Thereafter, the host interface 132 may estimate or predict what kind of operation the controller 130 will perform according to the characteristics of the command and the data. The host interface 132 may determine a processing order and a priority of commands and data, based at least on their characteristics. According to characteristics of commands and data, the buffer manager 52 may determine whether to store commands and data in the memory 144, or whether to deliver the commands and the data into the flash translation layer 40. The event queue 54 receives events, from the buffer manager 52, which are to be internally executed and processed by the memory system 110 or the controller 130 in response to the commands and the data so as to deliver the events into the flash translation layer 40 in the order received.

In accordance with an embodiment, the host interface 132 may perform the functions of the controller 130 of FIG. 1. The host interface 132 may set a memory of the host 102 as a slave and add the memory as an additional storage space which is controllable or usable by the controller 130.

In accordance with an embodiment, the flash translation layer 40 may include a state manager 42, a map manager (MM) 44, a host request manager (HRM) 46, and a block manager 48. The host request manager 46 may manage the events from the event queue 54. The map manager 44 may handle or control map data. The state manager 42 may perform garbage collection (GC) or wear leveling (WL). The block manager 48 may execute commands or instructions onto a block in the memory device 150.

By way of example but not limitation, the host request manager 46 may use the map manager 44 and the block manager 48 to handle or process requests according to the read and program commands, and events which are delivered from the host interface 132. The host request manager 46 may send an inquiry request to the map data manager 44, to figure out a physical address corresponding to the logical address which is received with the events. The host request manager 46 may send a read request with the physical address to the memory interface 142, to process the read request (i.e., handle the events). Further, the host request manager 46 may send a program request (or write request) to the block manager 48, to program received data to a specific page in the memory device 150. Then, the host request manager 46 may transmit a map update request corresponding to the program request to the map manager 44, to update an item relevant to the programmed data in mapping information between logical-to-physical addresses.

The block manager 48 may convert a program request delivered from the host request manager 46, the map data manager 44, and/or the state manager 42 into a program request used for the memory device 150, to manage memory blocks in the memory device 150. In order to maximize or enhance program or write performance of the memory system 110 (see FIG. 2), the block manager 48 may collect program requests and send program requests for multiple-plane and one-shot program operations to the memory interface 142. The block manager 48 sends several program requests to the memory interface 142 to enhance or maximize parallel processing of the multi-channel and multi-directional flash controller.

The block manager 48 may manage blocks in the memory device 150 according to the number of valid pages. Further, the block manager 48 may select and erase blocks having no valid pages when a free block is needed. Furthermore, the block manager 48 may select a block including the least valid page when it is determined that garbage collection is necessary. The state manager 42 may perform garbage collection to move the valid data to an empty block and erase the blocks containing the moved valid data so that the block manager 48 may have enough free blocks (i.e., empty blocks with no data). If the block manager 48 provides information regarding a block to be erased to the state manager 42, the state manager 42 may check all pages of the block to be erased to determine whether each page is valid. For example, in order to determine validity of each page, the state manager 42 may identify a logical address stored in an out-of-band (OOB) area of each page. To determine whether each page is valid, the state manager 42 may compare the physical address of the page with the physical address mapped to the logical address obtained from the inquiry request. The state manager 42 may send a program request to the block manager 48 for each valid page. A mapping table may be updated by the map manager 44 when the program operation is completed.

The map manager 44 may manage a logical-to-physical mapping table. The map manager 44 may process requests such as queries and updates, which are generated by the host request manager 46 or the state manager 42. The map manager 44 may store the entire mapping table in the memory device 150 (e.g., a non-volatile memory such as a flash memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made as well as the dirty map table may be stored in the memory device 150.

When garbage collection is performed, the state manager 42 copies valid page(s) into a free block, and the host request manager 46 may program the latest version of the data for the same logical address of the page and currently issue an update request. When the status manager 42 requests the map update in a state in which copying of valid page(s) is not completed normally, the map manager 44 may not perform the mapping table update. This is because the map request is issued with old physical information if the status manger 42 requests a map update and a valid page copy is completed later. The map manager 44 may perform a map update operation to ensure accuracy only if the latest map table still points to the old physical address.

The memory device 150 may include a plurality of memory blocks. The plurality of memory blocks may be classified into different types of memory blocks such as a single level cell (SLC) memory block, or a multi level cell (MLC) memory block, according to the number of bits that can be stored or represented in one memory cell. Here, the SLC memory block includes a plurality of pages implemented by memory cells, each storing one bit of data. The SLC memory block may have high performance and high durability. The MLC memory block includes a plurality of pages implemented by memory cells, each storing multi-bit data (e.g., two bits or more). The MLC memory block may have larger storage capacity in the same space than the SLC memory block. The MLC memory block may be highly integrated in a view of storage capacity. In an embodiment, the memory device 150 may be implemented with MLC memory blocks such as an MLC memory block, a triple level cell (TLC) memory block, a quadruple level cell (QLC) memory block and a combination thereof. The MLC memory block may include a plurality of pages implemented by memory cells, each capable of storing 2-bit data. The TLC memory block may include a plurality of pages implemented by memory cells, each capable of storing 3-bit data. The QLC memory block may include a plurality of pages implemented by memory cells, each capable of storing 4-bit data. In another embodiment, the memory device 150 may be implemented with a block including a plurality of pages implemented by memory cells, each capable of storing 5-bit or more bit data.

In an embodiment of the disclosure, the memory device 150 is embodied with a nonvolatile memory such as a flash memory for example, a NAND flash memory, or a NOR flash memory. Alternatively, the memory device 150 may be implemented with at least one of a phase change random access memory (PCRAM), a ferroelectrics random access memory (FRAM), a spin injection magnetic memory, and a spin transfer torque magnetic random access memory (STT-MRAM).

Figure 4:
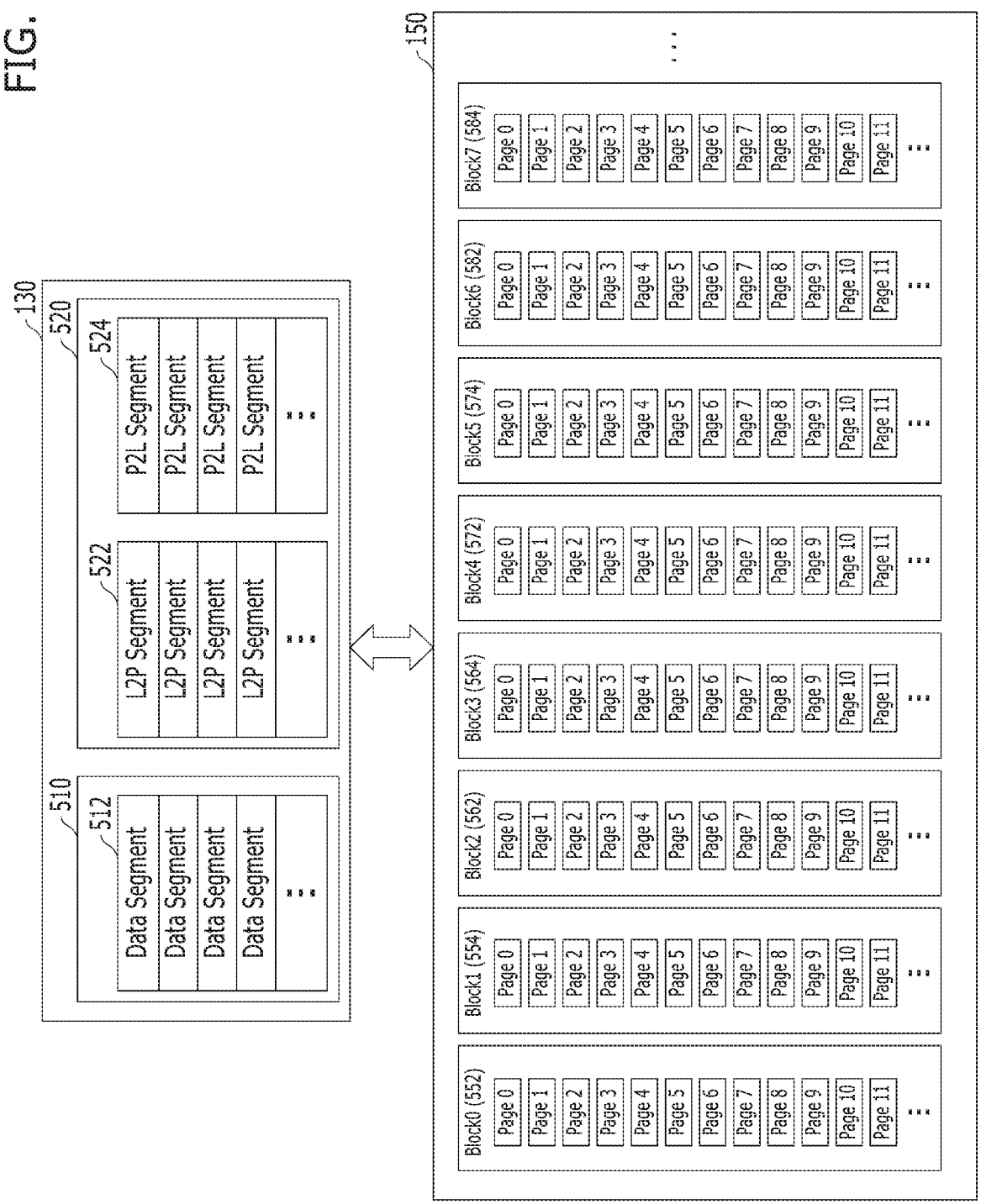
FIGS. 4 and 5 are diagrams illustrating examples of a plurality of command operations corresponding to a plurality of commands, which are performed by a memory system.
Figure 5:
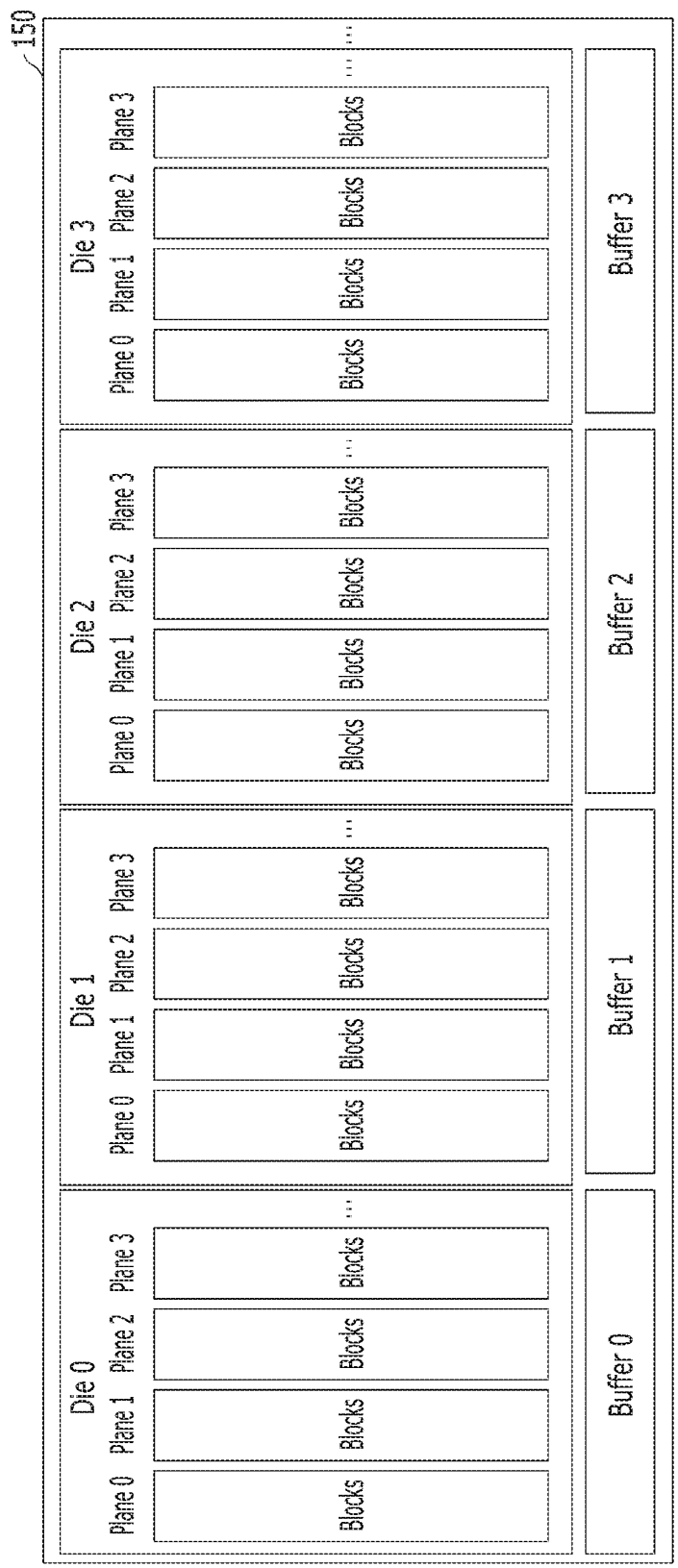

FIGS. 4 and 5 illustrate performing a plurality of command operations corresponding to a plurality of commands in the memory system in accordance with an embodiment of the disclosure. Detailed descriptions will be made for a data processing operation: in a case where a plurality of write commands are received from the host 102 of FIG. 2 and program operations corresponding to the write commands are performed; in another case where a plurality of read commands are received from the host 102 and read operations corresponding to the read commands are performed; in another case where a plurality of erase commands are received from the host 102 and erase operations corresponding to the erase commands are performed; or in another case where a plurality of write commands and a plurality of read commands are received together from the host 102 and program operations and read operations corresponding to the write commands and the read commands are performed.

Moreover, write data corresponding to a plurality of write commands from the host 102 are stored in a buffer/cache in the memory 144 of the controller 130, the write data stored in the buffer/cache are programmed to and stored in a plurality of memory blocks in the memory device 150, map data corresponding to the stored write data are updated in the plurality of memory blocks, and the updated map data are stored in the plurality of memory blocks in the memory device 150. In the embodiment of the disclosure, program operations corresponding to a plurality of write commands from the host 102 are performed. Furthermore, when a plurality of read commands are received from the host 102 for the data stored in the memory device 150, data corresponding to the read commands are read from the memory device 150 by checking the map data regarding the data corresponding to the read commands, the read data are stored in the buffer/cache in the memory 144 of the controller 130, and the data stored in the buffer/cache are provided to the host 102. In other words, read operations corresponding to a plurality of read commands from the host 102 are performed. In addition, when a plurality of erase commands are received from the host 102 for the memory blocks in the memory device 150, memory blocks are checked corresponding to the erase commands, the data stored in the checked memory blocks are erased, map data are updated corresponding to the erased data, and the updated map data are stored in the plurality of memory blocks in the memory device 150. Namely, erase operations corresponding to a plurality of erase commands from the host 102 are performed.

Furthermore, when the controller 130 performs command operations in the memory system 110, it is to be noted that, as described above, the processor 134 in the controller 130 may perform command operations in the memory system 110, through a flash translation layer (FTL). Also the controller 130 programs and stores user data and metadata corresponding to write commands from the host 102, in arbitrary memory blocks among the plurality of memory blocks in the memory device 150. The controller 130 also reads user data and metadata corresponding to read commands from the host 102, from arbitrary memory blocks among the plurality of memory blocks in the memory device 150, and provides the read data to the host 102. Furthermore, the controller 130 also erases user data and metadata, corresponding to erase commands entered from the host 102, from arbitrary memory blocks among the plurality of memory blocks in the memory device 150.

Metadata may include first map data including logical/physical or logical to physical (L2P) information (hereinafter, referred to as 'logical information'), and second map data including physical/logical or physical to logical (P2L) information (hereinafter, referred to as 'physical information'), for data stored in memory blocks corresponding to a program operation. The metadata may include information on command data corresponding to a command from the host 102, information on a command operation corresponding to the command, information on the memory blocks of the memory device 150 for which the command operation is to be performed, and information on map data corresponding to the command operation. In other words, metadata may include plural information and data excluding user data corresponding to a command from the host 102.

In the embodiment of the disclosure, when the controller 130 receives a plurality of write commands from the host 102, program operations corresponding to the write commands are performed. In other words, user data corresponding to the write commands are stored in empty memory blocks, open memory blocks, or free memory blocks for which an erase operation has been performed, among the memory blocks of the memory device 150. Also, first map data and second map data are stored in empty memory blocks, open memory blocks, or free memory blocks among the memory blocks of the memory device 150. First map data may include an L2P map table or an L2P map list including logical information as the mapping information between logical addresses and physical addresses for the user data stored in the memory blocks. Second map data may include a P2L map table or a P2L map list including physical information as the mapping information between physical addresses and logical addresses for the memory blocks stored with the user data.

When write commands are received from the host 102, the controller 130 stores user data corresponding to the write commands in memory blocks. The controller 130 stores, in other memory blocks, metadata including first map data and second map data for the user data stored in the memory blocks. Particularly, corresponding to data segments of the user data stored in the memory blocks of the memory device 150, the controller 130 generates and updates the L2P segments of first map data and the P2L segments of second map data as the map segments of map data among the meta segments of metadata. The controller 130 stores the updated L2P and P2L segments in the memory blocks of the memory device 150. The map segments stored in the memory blocks of the memory device 150 are loaded in the memory 144 in the controller 130 and are then updated.

When a plurality of read commands are received from the host 102, the controller 130 reads read data corresponding to the read commands, from the memory device 150, stores the read data in the buffers/caches in the memory 144 of the controller 130. The controller 130 provides the data stored in the buffers/caches, to the host 102.

When a plurality of erase commands are received from the host 102, the controller 130 checks memory blocks of the memory device 150 corresponding to the erase commands, and performs erase operations for the memory blocks.

When command operations corresponding to the plurality of commands from the host 102 are performed while a background operation is performed, the controller 130 loads and stores data corresponding to the background operation (that is, metadata and user data) in the buffer/cache in the memory 144. Then, the controller 130 stores the metadata and the user data in the memory device 150. By way of example but not limitation, the background operation may include a garbage collection operation or a read reclaim operation as a copy operation, a wear leveling operation as a swap operation or a map flush operation, For the background operation, the controller 130 may check metadata and user data corresponding to the background operation, in the memory blocks of the memory device 150. Further, the controller 130 may load and store the metadata and user data stored in certain memory blocks of the memory device 150, in the buffer/cache of the memory 144, and then store the metadata and user data, in certain other memory blocks of the memory device 150.

In the case of performing command operations as foreground operations, and a copy operation, a swap operation and a map flush operation as background operations, the controller 130 schedules queues corresponding to the foreground operations and the background operations. Further, the controller 130 allocates the scheduled queues to the memory 144 in the controller 130 and the memory in the host 102. In this regard, the controller 130 assigns identifiers (IDs) by respective operations for the foreground operations and the background operations to be performed in the memory device 150. Further, the controller 130 schedules queues corresponding to the operations assigned with the identifiers, respectively. In accordance with the embodiment of the disclosure, identifiers are assigned not only by respective operations for the memory device 150 but also by functions for the memory device 150, and queues corresponding to the functions assigned with respective identifiers are scheduled.

In accordance with the embodiment of the disclosure, the controller 130 manages the queues scheduled by the identifiers of respective functions and operations to be performed in the memory device 150. The controller 130 manages the queues scheduled by the identifiers of a foreground operation and a background operation to be performed in the memory device 150. In accordance with the embodiment of the disclosure, after memory regions corresponding to the queues scheduled by identifiers are allocated to the memory 144 and a memory in the host 102, the controller 130 manages addresses for the allocated memory regions. The controller 130 performs not only the foreground operation and the background operation but also respective functions and operations in the memory device 150, by using the scheduled queues.

Referring to FIG. 4, the controller 130 performs command operations corresponding to a plurality of commands from the host 102. For example, the controller 130 performs program operations corresponding to a plurality of write commands from the host 102. At this time, the controller 130 programs and stores user data corresponding to the write commands, in memory blocks of the memory device 150. In correspondence to the program operations with respect to the memory blocks, the controller 130 generates and updates metadata for the user data and stores the metadata in the memory blocks of the memory device 150.

The controller 130 generates and updates first map data and second map data which include information indicating that the user data are stored in pages in the memory blocks of the memory device 150. That is, the controller 130 generates and updates L2P segments as the logical segments of the first map data and P2L segments as the physical segments of the second map data. Then, the controller 130 stores the L2P and P2L segments in pages in the memory blocks of the memory device 150.

For example, the controller 130 caches and buffers the user data corresponding to the write commands from the host 102, in a first buffer 510 as a data buffer/cache of the memory 144. Particularly, after storing data segments 512 of the user data in the first buffer 510, the controller 130 stores the data segments 512 of the first buffer 510 in pages in the memory blocks of the memory device 150. As the data segments 512 are programmed to and stored in the pages of the memory blocks of the memory device 150, the controller 130 generates and updates the first map data and the second map data. The controller 130 stores the first map data and the second map data in a second buffer 520 of the memory 144. Particularly, the controller 130 stores L2P segments 522 of the first map data and P2L segments 524 of the second map data for the user data, in the second buffer 520 as a map buffer/cache. As described above, the L2P segments 522 and the P2L segments 524 may be stored in the second buffer 520 of the memory 144. A map list for the L2P segments 522 and another map list for the P2L segments 524 may be stored in the second buffer 520. The controller 130 stores the L2P segments 522 and the P2L segments 524, which are stored in the second buffer 520, in pages included in the memory blocks of the memory device 150.

The controller 130 performs command operations corresponding to a plurality of commands received from the host 102. For example, the controller 130 performs read operations corresponding to a plurality of read commands received from the host 102. Particularly, the controller 130 loads L2P segments 522 of first map data and P2L segments 524 of second map data as the map segments of user data corresponding to the read commands, in the second buffer 520. Further, the controller 130 checks the L2P segments 522 and the P2L segments 524. Then, the controller 130 reads the user data stored in pages of corresponding memory blocks among the memory blocks of the memory device 150, stores data segments 512 of the read user data in the first buffer 510, and then provides the data segments 512 to the host 102.

The controller 130 performs command operations corresponding to a plurality of commands entered from the host 102. For example, the controller 130 performs erase operations corresponding to a plurality of erase commands from the host 102. In particular, the controller 130 checks memory blocks corresponding to the erase commands among the memory blocks of the memory device 150 to carry out the erase operations for the checked memory blocks.

In the case of performing an operation of copying data or swapping data among the memory blocks in the memory device 150, for example, a garbage collection operation, a read reclaim operation or a wear leveling operation, as a background operation, the controller 130 stores data segments 512 of corresponding user data, in the first buffer 510, and loads map segments 522, 524 of map data corresponding to the user data, in the second buffer 520. Then, the controller 130 performs the garbage collection operation, the read reclaim operation, or the wear leveling operation. In the case of performing a map update operation and a map flush operation for metadata, e.g., map data, for the memory blocks of the memory device 150 as a background operation, the controller 130 loads the corresponding map segments 522, 524 in the second buffer 520, then performs the map update operation and the map flush operation.

As aforementioned, in the case of performing functions and operations including a foreground operation and a background operation for the memory device 150, the controller 130 assigns identifiers by the functions and operations to be performed for the memory device 150. The controller 130 schedules queues respectively corresponding to the functions and operations assigned with the identifiers, respectively. The controller 130 allocates memory regions corresponding to the respective queues, to the memory 144 in the controller 130 and the memory in the host 102. The controller 130 manages the identifiers assigned to the respective functions and operations, the queues scheduled for the respective identifiers and the memory regions allocated to the memory 144 and the memory of the host 102 corresponding to the queues, respectively. The controller 130 performs the functions and operations for the memory device 150, through the memory regions allocated to the memory 144 and the memory of the host 102.

Referring to FIG. 5, the memory device 150 includes a plurality of memory dies. For example, the memory device 150 includes a memory die 0, a memory die 1, a memory die 2 and a memory die 3. Each of the memory dies includes a plurality of planes, for example, a plane 0, a plane 1, a plane 2 and a plane 3. The respective planes include a plurality of memory blocks. For example, each plane includes N number of blocks Block0 to BlockN−1. Each block includes a plurality of pages, for example, 2M number of pages. Moreover, the memory device 150 includes a plurality of buffers corresponding to the respective memory dies. For example, the memory device 150 includes a buffer 0 corresponding to the memory die 0, a buffer 1 corresponding to the memory die 1, a buffer 2 corresponding to the memory die 2 and a buffer 3 corresponding to the memory die 3.

In the case of performing command operations corresponding to a plurality of commands from the host 102, data corresponding to the command operations are stored in buffers of the memory device 150. For example, in the case of performing program operations, data corresponding to the program operations are stored in the buffers, and are then stored in pages of the memory blocks. In the case of performing read operations, data corresponding to the read operations are read from the pages of the memory blocks, are stored in the buffers, and are then provided to the host 102 through the controller 130.

In the embodiment of the disclosure, while it will be described below as an example that the buffers of the memory device 150 exist outside the respective corresponding memory dies, it is to be noted that the buffers may exist inside the respective corresponding memory dies, and it is to be noted that the buffers may correspond to the respective planes or the respective memory blocks in the respective memory dies. Further, it is to be noted that the buffers may be a plurality of caches or a plurality of registers in the memory device 150.

The plurality of memory blocks in the memory device 150 may be grouped into a plurality of super memory blocks. Command operations may be performed in the plurality of super memory blocks. Each of the super memory blocks may include a plurality of memory blocks, for example, memory blocks included in a first memory block group and a second memory block group. In the case where the first memory block group is included in the first plane of a certain first memory die, the second memory block group may be included in the first plane of the first memory die, may be included in the second plane of the first memory die or may be included in the planes of a second memory die.

In an embodiment of the disclosure, a data processing system may include plural memory systems. Each of the plural memory systems 110 may include the controller 130 and the memory device 150. In the data processing system, one of the plural memory systems 110 may be a master and the others may be a slave. The master may be determined based on contention between the plural memory systems 110. When a plurality of commands is received from the host 102, the master may determine a destination of each command based at least on statuses of channels or buses. For example, a first memory system may be determined as a master memory system among a plurality of memory systems, corresponding to information delivered from the plurality of memory systems. If the first memory system is determined as the master memory system, the remaining memory systems are considered slave memory systems. A controller of the master memory system may check statuses of a plurality of channels (or ways, buses) coupled to the plurality of memory systems, to select which memory system handles commands or data received from the host 102. In an embodiment, a master memory system may be dynamically determined among the plural memory systems.

In another embodiment, a master memory system may be changed with one of the other slave memory systems periodically or according to an event.

Hereinafter, a method and apparatus for transferring data in the memory system 110 including the memory device 150 and the controller 130 will be described in more detail. As the amount of data stored in the memory system 110 becomes larger, the memory system 110 may be required to read or store large amounts of data at a time. However, a read time for reading data stored in the memory device 150 or a program/write time for writing data in the memory device 150 may be generally longer than a handling time for the controller 130 to process data or a data transmission time between the controller 130 and the memory device 150. For example, the read time might be twice that of the handling time. Since the read time or the program time is relatively much longer than the handling time or the data transmission time, a procedure or a process for delivering data in the memory system 110 may affect performance of the memory system 110, e.g., an operation speed, and/or structure of the memory system 110, such as a buffer size.

Figure 6:
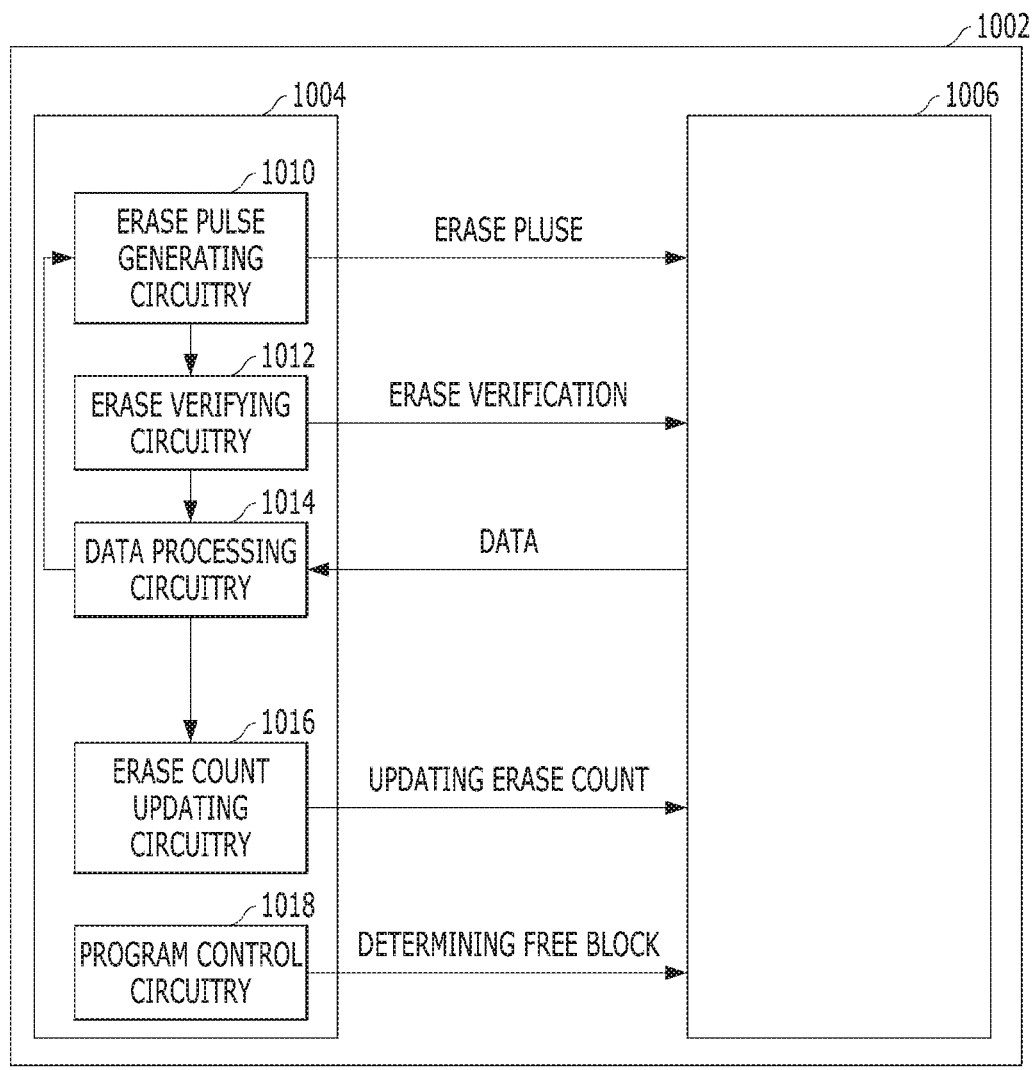
FIG. 6 is a diagram illustrating a memory system in accordance with an embodiment of the disclosure.

FIG. 6 illustrates a memory system 1002 in accordance with an embodiment of the disclosure. Referring to FIG. 6, the memory system 1002 may include a controller 1004 and a memory device 1006.

The memory device 1006 may include a plurality of blocks capable of storing data. The controller 1004 may include an erase pulse generating circuitry 1010, an erase verifying circuitry 1012, a data processing circuitry 1014, an erase count updating circuitry 1016, and a program control circuitry 1018.

The memory device 1006 having a property that stored data is maintained even when power is not supplied may include a plurality of blocks capable of storing data. The controller 1004 is used for improving an operational safety and an operational speed of the memory device 1006 and outputs data stored in the memory device 1006. By way of example but not limitation, the memory device 1006 may store data received from the controller 1004 during a program or write operation. During a read operation, the memory device 1006 may provide stored data to the controller 1004. The controller 1004 may erase data stored in the memory device 1006 during an erase operation.

Each of plural blocks in the memory device 1006 may include a plurality of pages. Each page may include a plurality of memory cells coupled via at least one word line (WL).

A case where all pages are empty and there is no valid data may be considered a free block. A free block indicates that new data may be stored or programmed in any cell of the page therein.

The controller 1004 may perform an erase operation on a specific block in the memory device 1006 for erasing all data in that block. Since a block includes a plurality of pages, each including a plurality of unit cells, and data stored in each cell may have different status, it might be not efficient to erase all data in the block by a single erase operation. The erase operation performed on a block basis may include a plurality of sub erase operations corresponding to a plurality of erase pulses. In addition, increasing a level of the erase voltage to erase all data in the block through a single erase operation may damage some of unit cells. Therefore, the controller 1004 may erase data in a predetermined block step by step, in response to the plurality of erase pulses. That is, a single erase operation may include plural sub erase operations, and each plural sub erase operation may correspond to each erase pulse.

The erase pulse generating circuitry 1010 may generate plural erase pulses to perform an erase operation on a block in the memory device 1006. The erase verifying circuitry 1012 may generate a pulse or a signal for checking an erase result immediately after a sub erase operation is carried out based on the erase pulse generated by the erase pulse generating circuitry 1010. Here, the pulse or the signal for checking the erase result may have a predetermined voltage level to check data of the block erased by the erase pulse.

The sub erase operation may include an operation performed by an erase pulse generated by the erase pulse generating circuitry 1010 and another operation performed by the signal generated by the erase verifying circuitry 1012. In a single erase operation, a level of the erase pulse may be increased by a predetermined value or maintained in a predetermined range. The pulse for verifying the erase result may be kept constant in a predetermined level during the single erase operation.

For example, an erase pulse may be applied as a body (e.g., a well region) voltage of all unit cells in a block. When the erase pulse is applied to a unit cell, the charge trapped in a floating gate moves so that a threshold voltage of the unit cell may be changed. A pulse for checking an erase result may be applied to a word line coupled to the unit cell of the block. When a pulse for verifying the erase result is applied to the word line, the unit cell may output the current flowing through a channel between source/drain of the unit cell including the floating gate. The channel may be made in response to a changed threshold voltage.

Hereinafter, the erase pulse used for the sub erase operation is distinguished from the pulse for verifying the erase result.

The data processing circuitry 1014 may check whether the erase pulse makes charges trapped in floating gates move to predetermined locations (that is, data stored in unit cells are erased) through the pulse for verifying the erase result generated by the erase verifying circuitry 1012. In response to the check result, the data processing circuitry 1014 may determine which level of erase pulse is generated by the erase pulse generating circuitry 1010 and issue an instruction to the erase pulse generating circuitry 1010. When the erase operation is begun, the data processing circuitry 1014 may issue an instruction to the erase pulse generating circuitry 1010 to generate a first or initial erase pulse. After the erase pulse generating circuitry 1010 generates the first erase pulse, the pulse for verifying the erase result may be generated by the erase verifying circuitry 1012 in response to the first erase pulse. The data processing circuitry 1014 checks whether the first erase pulse makes the charges move to predetermined locations. The data processing circuitry 1014 may transmit the instruction to the erase pulse generating circuitry 1010 in response to the checked result.

In accordance with an embodiment, the data processing circuitry 1014 may count the pulses for verifying the erase result, which are generated by the erase verifying circuitry 1012. Accordingly, the number of sub erase operations may be counted indirectly. If time spent on each sub erase operation is known, a total time of the erase operation performed through a predetermined number of sub erase operations may be estimated.

The data processing circuitry 1014 may count data received from the memory device 1006 without counting the pulses for verifying the erase result. Since each data corresponding to each pulse for verifying the erase result is received from the memory device 1006, the data processing circuitry 1014 may count the data to recognize how many sub erase operations have been performed.

The data processing circuitry 1014 may measure the total time of the erase operation. When the time consumed for each sub erase operation and the number of sub erase operation performed are recognized, the controller 1004 may estimate the total time spent on the erase operation, i.e., from a timing when the erase operation is begun to a timing when all data of the block are deleted.

During the erase operation, when it is determined that data in a plurality of unit cells in a specific block are completely erased in response to a first erase pulse, the erase pulse generating circuitry 1010 may not generate an additional erase pulse for that the specific block. When at least some of the data is not erased in response to the first erase pulse, the erase pulse generating circuitry 1010 may generate a second erase pulse having the same voltage level or a higher voltage level. If all data in that block are erased in response to the first erase pulse, the erase pulse generating circuitry 1010 may not be required to generate or output the second erase pulse.

The sub erase operation may be repeatedly performed until all data in the block to which the erase pulse is applied are erased. Whenever the sub erase operation is performed, the data processing circuitry 1014 may count the erase result. There may be a predetermined cycle (i.e., an erase cycle or an operational margin for each erase operation) to perform a single erase operation in the memory system 1002. The sub erase operation may be repeated within the erase cycle. When the sub erase operation is repeatedly performed during the erase cycle but all data in a specific block are not erased, the memory system 1002 may determine that block as a bad block and suspend its use as a free block.

In an embodiment of the disclosure, the sub erase operation may include sub operations corresponding to a single erase pulse and a pulse for verifying a corresponding erase result. A time required for each sub erase operation is always identical, a time required for erasing all data in a specific block may be determined based on the number of sub erase operations. In accordance with an embodiment, the sub erase operation may include sub operations associated with two or more erase pulses, and a pulse for verifying an erase result. That is, in a single sub erase operation, the verification operation may be performed after two or more sub erase operations are performed. Further, a time allowed for each sub erase operation may be dynamically and differently set.

The erase count updating circuitry 1016 may increase an erase count of a specific block based on information when the controller 1004 completes an erase operation performed on that block to which at least one erase pulse is applied in the memory device 1006. The information obtained after the erase operation is completed may include the number of sub erase operations and/or an erase time from the start of the first sub erase operation to the time when all data are erased. For example, the controller 1004 may variably increase the erase count of that block by comparing the information obtained after the erase operation is completed with information regarding a predetermined range.

In an embodiment of the disclosure, after the erase operation is completed for a specific block to which the erase pulse is applied, the data processing circuitry 1014 may determine an increment of the erase count regarding that block based on the number of sub erase operations performed on that block. By way of example but not limitation, the controller 1004 may increase the erase count by a first value when the number of sub erase operation is identical to a predetermined threshold. The controller 1004 may increase the erase count by a second value less than the first value when the number of sub erase operation is less than the predetermined threshold. The controller 1004 may increase the erase count by a third value greater than the first value when the number of sub erase operation is greater than the predetermined threshold. When the first value is 1, the second value is less than 1 and the third value is greater than 1. Accordingly, when a single ease operation is performed on a specific block, the controller 1004 does not increase an erase count of that block by a constant value (e.g., 1). In an embodiment, the controller 1004 may increase the erase count of that block by a different value (e.g., 0.3, 0.5, 0.7, 1, 1.5 or the like).

In accordance with an embodiment, the erase time may be estimated based on the counted number of sub erase operations. The sub erase operation may correspond to the erase pulse set in advance, and a time for which each sub erase operation is performed, is set. Thus, an erase time may be estimated by multiplying the counted number of sub erase operations by the time required for each sub erase operation. By way of example but not limitation, a time required for each sub erase operation is 1 second, and the sub erase operation is performed 100 times. In this case, the erase time may be estimated to be 100 seconds.

In an embodiment of the disclosure, after the erase operation is completed for a specific block to which the erase pulse is applied, the data processing circuitry 1014 determines an erase count of that block based on an erase time estimated or measured. By way of example but not limitation, the controller 1004 may increase the erase count by a first value when the time interval is equal to a predetermined threshold. The controller 1004 may increase the erase count by a second value less than the first value when the time interval is less than the predetermined threshold. The controller 1004 may increase the erase count by a third value greater than the first value when the time interval is greater than the predetermined threshold. It is possible to variably increase the erase count according to the time taken for all data to be erased in a single erase operation, instead of increasing the erase count equally by a preset value through the single erase operation. In an embodiment, the time may be measured based on clock information from a start timing to an end timing.

In accordance with an embodiment, when a time from the start of the first sub erase operation to the time at which all data of a specific block is erased may be measured, the number of sub erase operations performed on that block may be determined or estimated without being counted. A sub erase operation may be performed corresponding to the erase pulse, and an operation cycle or time for which each sub erase operation is performed is set. Therefore, the number of sub erase operations may be estimated by dividing the measured erase time by the operation cycle or time allowed for each sub erase operation. For example, a time allowed for each sub erase operation is 1 second, and the measured time for the erase operation is 100 seconds. In this case, it may be estimated that the sub erase operation is performed 100 times.

The erase count updating circuitry 1016 may not increase an erase count of a specific block when it is checked that all data in that block has been erased before a first or initial sub erase operation is performed, or when any sub erase operation for that block is not performed even in response to an erase command.

The program control circuitry 1018 may make the controller 1004 determine which free block is preferentially used among plural free blocks in the memory device 1006. For example, a free block may be used for programming data, e.g., when it is necessary to store large amount of data received from a host, or to transfer large data for operations such as wear leveling or garbage collection. The program control circuitry 1018 may perform a process of selecting a free block. The program control circuitry 1018 may select at least one free block among the blocks in the memory device 1006. Then, the program control circuitry 1018 may select a free block having the lowest erase count among the at least selected free block. The program control circuitry 1018 may perform a process of programming or writing data to that free block selected based on its erase count value.

As used in the disclosure, the term 'circuitry' may refer to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" would also cover an implementation of a processor (or multiple processors) or portion of a processor and its (or their) accompanying software and/or firmware. The term "circuitry" would also cover, for example and if applicable to a particular claim element, an integrated circuit for a storage device.

Figure 7:
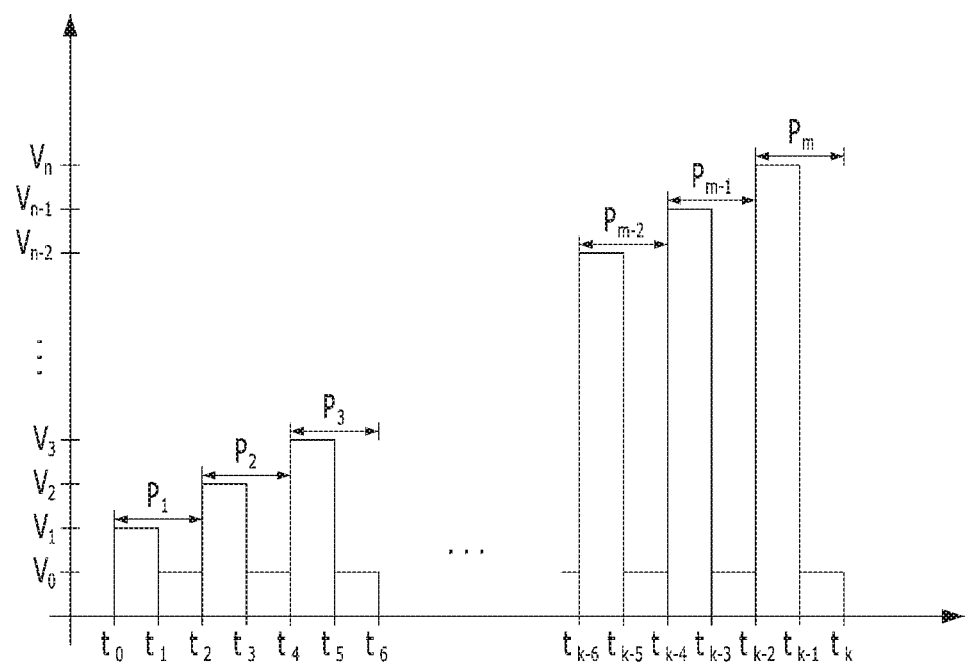
FIG. 7 is a timing diagram illustrating an erase operation in accordance with an embodiment of the disclosure.

FIG. 7 illustrates an example of an erase operation in accordance with an embodiment of the disclosure.

For example, FIG. 7 shows the erase operation including a plurality of sub erase operations. Particularly, FIG. 7 shows the change in voltage levels of supplied pulses used for each sub erase operation along with time. An x-axis represents a time and an y-axis represents a voltage level. The x-axis includes k times $t_0$ to $t_k$, and the y-axis includes n voltage levels $V_0$ to $V_n$. Here, k may be a natural number of 7 or more, and n may be a natural number of 4 or more.

In an embodiment of the disclosure, each sub erase operation includes sub operations in response to a single erase pulse and a pulse for verifying an erase result corresponding to the single erase pulse. Herein, the sub operations may take the same amount of time. Each of the sub operations corresponds to the erase pulse and the pulses for verifying the erase result. Further, $P_1$ to $P_m$ represent sections consumed for each sub erase operation, which may be identical each other.

The discrete points of time $t_0$ to $t_k$ may have an identical time interval between the respective points. The discrete points in the y-axis may correspond to voltage levels having a predetermined difference. For example, a first voltage level V0 is used for the pulse for verifying the erase result and a second voltage level V1 is used for the first erase pulse. $V_2$ to $V_n$ are used for the second to n-th erase pulse applied to a specific block step by step.

The erase operation may include a plurality of sub erase operations. Each of the sub erase operations may include sub operations corresponding to a single erase pulse and a pulse for verifying a corresponding erase result. Sections $P_1$ to $P_m$ are operation margins for sub erase operations. Herein, m may be a natural number of 4 or greater.

The first section $P_1$ between two timings $t_0$, $t_2$ may be allocated for the first sub erase operation. In the first section $P_1$, there are a sub operation in response to an erase pulse having the second voltage level $V_1$ in the period of $t_0$ to $t_1$, and another operation in response to a pulse for verifying the erase result, which has the first voltage level $V_0$ in the interval of $t_1$ to $t_2$. Herein, the erase pulse and the pulse for verifying are separate signals applied to the memory device 1006, respectively.

The second sub erase operation may be performed in the second section $P_2$ between two timings $t_2$, $t_4$. In the second section $P_2$, there are a sub operation in response to an erase pulse having the third voltage level $V_2$ in the period of $t_2$ to $t_3$, and another operation in response to a pulse for verifying the erase result, which has the first voltage level $V_0$ in the interval of $t_3$ to $t_4$.

The third second section $P_3$ between two timings $t_4$, $t_6$ may be allocated for the third sub erase operation. In the third section $P_3$, there are a sub operation in response to an erase pulse having the fourth voltage level $V_3$ in the period of $t_4$ to $t_5$, and another operation in response to a pulse for verifying the erase result, which has the first voltage level $V_0$ in the interval of $t_5$ to $t_6$.

The (m−2)-th second section $P_{m-2}$ between two timings $t_{k-6}$, $t_{k-4}$ may be allocated for the (m−2)-th sub erase operation. In the (m−2)-th section $P_{m-2}$, there are a sub operation in response to an erase pulse having the (n−1)-th voltage level $V_{n-2}$ in the period of $t_{k-6}$ to $t_{k-5}$, and another operation in response to a pulse for verifying the erase result, which has the first voltage level $V_0$ in the interval of $t_{k-5}$ to $t_{k-4}$.

The (m−1)-th sub erase operation may be performed in the (m−1)-th section $P_{m-1}$ between two timings $t_{k-4}$, $t_{k-2}$. In the second section $P_{m-1}$, there are a sub operation in response to an erase pulse having the n-th voltage level $V_{n-1}$ in the period of $t_{k-4}$ to $t_{k-3}$, and another operation in response to a pulse for verifying the erase result, which has the first voltage level $V_0$ in the interval of $t_{k-3}$ to $t_{k-2}$.

The m-th second section $P_m$ between two timings $t_{k-2}$, $t_k$ may be allocated for the m-th sub erase operation. In the m-th section $P_m$, there are a sub operation in response to an erase pulse having the (n+1)-th voltage level $V_n$ in the period of $t_{k-2}$ to $t_{k-1}$, and another operation in response to a pulse for verifying the erase result, which has the first voltage level $V_0$ in the interval of $t_{k-1}$ to $t_k$.

The single erase operation for a specific block may include plural sub erase operations. The controller 1004 may variably increase an erase count of that block by counting the number of sub erase operations performed after completion of the erase operation. For example, a value of 0.1 may be assigned to each sub erase operation. When the sub erase operation is performed three times or ten times, the erase count is increased by 0.3 or 1. In another example, the controller 1004 may determine which predetermined range the counted number of sub erase operations falls into. For example, a value of 0.5 is assigned one time to five times, and a value of 1 is assigned six times to ten times. When the sub erase operation is performed eight times, the erase count is increased by 1.

For example, the controller 1004 increases the erase count by a real number x when the number of the sub erase operations is in the predetermined range. The controller 1004 increases the erase count by a value less than the real number x when the number of the sub erase operations is less than the predetermined range. The controller 1004 increases the erase count by a value greater than the real number x when the number of the sub erase operations is greater than the predetermined range. The erase count may be variably increased according to how many sub erase operations have been performed in a single erase operation, rather than by a regular value corresponding to the single erase operation.

Figures 8, 9:
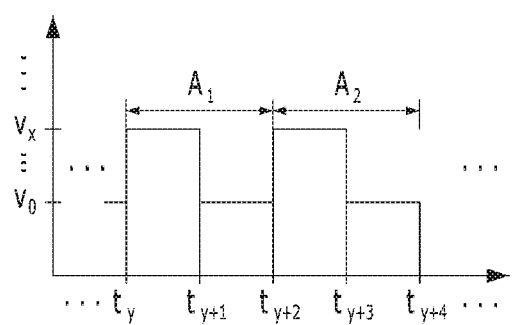
FIG. 8 is a timing diagram illustrating an erase operation in accordance with an embodiment of the disclosure.
FIG. 9 is a diagram illustrating changing an erase count regarding a block in accordance with an embodiment of the disclosure.

FIG. 8 illustrates an erase operation in accordance with an embodiment of the disclosure.

For example, FIG. 8 shows the erase operation including a plurality of sub erase operations. Particularly, FIG. 8 shows no change in voltage levels of supplied pulses used for each sub erase operation along with time. An x-axis represents time and an y-axis represents voltage level. The x-axis includes times $t_y$ to $t_{y+4}$, and the y-axis includes voltage levels $V_0$ to $V_x$. Here, y and x may be a natural number.

After performing a sub erase operation corresponding to an erase pulse, the controller 1004 may generate a pulse for verifying that the erase pulse has shifted charges by a target amount (i.e., all data are erased). In response to a result, the controller 1004 may determine whether a next sub erase operation is performed. If all data in plural unit cells of a specific block are not erased corresponding to the erase pulse, the controller 1004 may generate a next erase pulse having the same voltage level with the erase pulse.

In FIG. 8, when all data are not erased in a plurality of unit cells of the block in response to the erase pulse, the controller 1004 generates another erase pulse having the same level of voltage as the previous one.

The section $A_1$ between two timings $t_y$, $t_{y+2}$ may be allocated for the sub erase operation. In the section $A_1$, there are a sub operation in response to an erase pulse having a voltage level $V_x$ in the period of $t_y$ to $t_{y+1}$, and another operation in response to a pulse for verifying the erase result, which has the first voltage level $V_0$ in the interval of $t_{y+1}$ $t_{y+2}$. The erase pulse may not be applied in the interval of $t_y$ to $t_{y+1}$. Herein, the erase pulse and the pulse for verifying are separate signals applied to the memory device 1006 respectively. For example, the first voltage level $V_0$ is 10V, and the voltage level $V_x$ is 20V. The erase pulse of 20V is applied to a body (well region) of plural unit cells in a specific block.

The section $A_2$ between two timings $t_{y+2}$, $t_{y+4}$ may be allocated for the sub erase operation. In the section $A_2$, there are a sub operation in response to an erase pulse having the voltage level $V_x$ in the period of $t_{y+2}$ to $t_{y+3}$, and another operation in response to a pulse for verifying the erase result, which has the first voltage level $V_0$ in the interval of $t_{y+3}$ to $t_{y+4}$.

When all data in a specific block are not erased by the sub erase operation in the section $A_1$, another sub erase operation using another erase pulse having the same voltage level as the previous one may be performed in another section $A_2$.

When all data are not erased by the sub erase operation in the section $A_2$, another sub erase operation using another erase pulse having the same voltage level as the previous one may be performed multiple times.

As shown in FIG. 8, an erase pulse having the same voltage level is generated repeatedly so that the sub erase operation is performed multiple times. For example, when all data are not erased by an initial sub erase operation so that a goal of erase operation is not achieved, a following sub erase operation may be performed repeatedly. Also, if all data are not erased through plural sub erase operations, the sub erase operation using an erase pulse having a higher voltage level may be performed one or more times.

FIG. 9 illustrates an example of a change in erase counts regarding blocks in accordance with an embodiment of the disclosure.

In FIG. 9, tables TB_A, TB_B illustrate an erase count for a block where an erase operation is performed and an erase count for each block is changed.

The first table TB_A shows the blocks BLK1 to BLKn, which are blocks in which data stored therein is scheduled by the controller 1004 to be erased. The second table TB_B shows the change of erase counts regarding the blocks BLK1 to BLKn included in the first table TB_A after one erase operation is completed. Herein, n may be a natural number of 5 or greater.

The first table TB_A includes an erase count EC regarding each of the blocks BLK1 to BLKn, before the erase count is updated respectively. The erase counts of the blocks BLK1, BLK2, BLK3, BLK (n−1), and BLKn are 9, 6, 3, 7 and 5, respectively.

The second table TB_B includes an erase count EC regarding each of the blocks BLK1 to BLKn, after the erase count is updated respectively. The erase counts of the blocks BLK1, BLK2, BLK3, BLK (n−1), and BLKn are 9.9, 7.2, 3.1, 7.0 and 5.5, respectively.

Regarding the change of the erase count updated by a single erase operation, the erase count of the first block BLK1 is changed by 0.9 from 9.0 to 9.9. The erase count of the second block BLK2 is changed by 1.2 from 6 to 7.2. The erase count of the third block BLK3 is changed by 0.1 from 3.1 to 3.1. The erase count of the (N−1)-th block BLK(n−1) is not increased from 7.0 to 7.0. The erase count of the n-th block BLKn is increased by 0.5 from 5 to 5.5.

Conventionally, when erasing data in a block, the controller 1004 may increase the erase count for that block by 1 (or a predetermined fixed value). But, in an embodiment of the disclosure, an increment of each erase count may be varied or different. Also, there may be a case where the erase count is not changed like the (n−1)-th block BLK(n−1). For example, if all data in a specific block have already been erased before the erase operation is performed, it may not be necessary to change or increase an erase count of that block since the erase operation may not be performed in response to an erase command.

The operating characteristics of each block in the memory device 1006 may be determined in a manufacturing process, or may be determined according to patterns, and characteristics of data stored in that block. Due to this, a time consumed for erasing all data stored in a block of the memory device 1006 may be different. This may affect an operational status (e.g., lifetime, healthy, etc.) of each block in the memory device 1006. The operation status of each block may affect the time for erasing all data of that block. Further, the time of erasing may be a criterion for determining whether that block operates normally. When an erase count of a block may be determined more precisely or accurately based on characteristics of each block in the memory device 1006, there is an advantage that wear leveling may be performed more effectively.

Figures 10, 11:
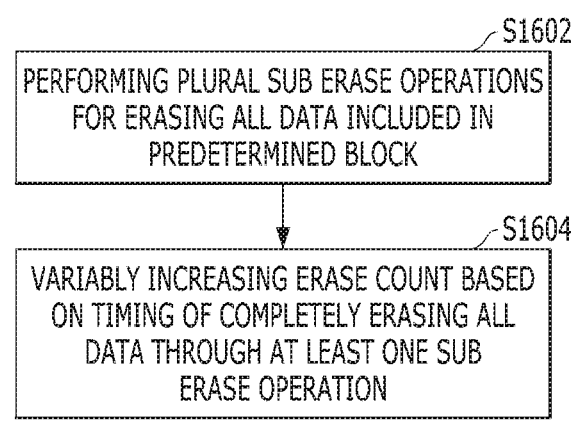
FIG. 10 is a diagram illustrating a list including block information in accordance with an embodiment of the disclosure.
FIG. 11 is a flowchart illustrating a method for operating a memory system in accordance with an embodiment of the disclosure.

FIG. 10 illustrates an example of a list including plural block information in accordance with an embodiment of the disclosure.

All blocks of the memory device 1006 have an erase count, respectively. An erase count of a block may be updated every time when the erase operation of that block is completed. For example, FIG. 10 shows the block information including an erase count of a block and an indicator indicating whether a block is considered a free block.

Referring to FIG. 10, based on a third table TB_C, the controller 1004 may check an erase count EC regarding each of the blocks BLK1 to BLKn, and recognize whether a block is a free block used for programming new data. Here, n may be a natural number of 5 or more. Information flag F/N may indicate which block is a free block F or a non-free block N.

The free block may include a block in which data in all the pages are not stored by the erase operation (i.e., is not currently used but ready to be programmed). The non-free block may include an open block and a closed block. That is, the non-free block includes a block of which at least one page in the block is used for storing data.

The third table TB_C may include all the blocks BLK1 to BLKn in the memory device 1006, and an erase count EC of each block and a flag F/N indicating whether each block is considered a free block. The first block BLK1 is a free block and has an erase count of 42. The second block BLK2 has an erase count of 23 and is a non-free block. The third block BLK3 has an erase count of 19 and is a free block. The (n−1)-th block BLK(n−1) has an erase count of 7 and is a non-free block. The n-th block BLKn has an erase count of 12 and is a free block.

The controller 1004 may preferentially use the free block with a lowest erase count. Among the blocks in the third table TB_C, the n-th block BLKn may be used first other than the other free blocks.

FIG. 11 is a flowchart illustrating an operation method of a memory system in accordance with an embodiment of the disclosure. The operation method of FIG. 11 may be performed by the memory system 1002 including the controller 1004 and the memory device 1006 in FIG. 6.

When a specific block in the memory device 1006 is erased more frequently than other blocks in the memory device 1006, that block may no longer be used or considered as the bad block so that a total storage space of the memory device 1006 may be reduced. Accordingly, the memory system 1002 may require a method of using each block of the memory device 1006 in a balanced manner, such as wear levelling.

Referring to FIG. 11, the operation method of the memory system 1002 may include performing plural sub erase operations for erasing all data included in a predetermined block (S1602). Further, the operation method may include variably increasing an erase count based on a timing of completely erasing all data through at least one sub erase operation (S1604). Herein, the sub erase operation may be considered a sub erase operation described in FIG. 6.

At the step S1602, the memory system 1002 may erase data stored in the memory device 1006 on a block-by-block basis through an erase operation performed by the controller 1004. The erase operation performed on a block-by-block basis of the memory system 1002 may include a plurality of sub erase operations, each corresponding to each of plural erase pulses. In addition, in the erase operation, the memory system 1002 may erase all data in a specific block stepwise, in response to the plural erase pulses.

At the step S1604, the memory system 1002 may variably increase an erase count of the corresponding block at a time point when the erase operation of that block is completed. Specifically, instead of increasing the erase count by a predetermined fixed value (e.g., 1) after a single erase operation, the erase count may be varied (increased) depending on how many sub erase operations have been performed for the single erase operation. In accordance with an embodiment, the erase count may be variably increased based on a time spent on the single erase operation.

Although not shown, the memory system 1002 may not increase an erase count regarding a specific block of the memory device 1006 if all data of that block has already been erased before the sub erase operation is performed, or if an erase operation corresponding to an erase command is not performed. For example, when a pre-sensing is first performed in response to the erase command of the memory system 1002, the controller 1004 may check whether all data of the corresponding block has already been erased. The controller 1004 may not increase the erase count of that block.

As not shown, the memory system 1002 may preferentially use free blocks with relatively lower erase counts (e.g., lowest erase count). For example, in a case where a large amount of data received from a host needs to be stored, or a case of moving voluminous data in the memory system 1002 for an operation such as wear leveling or garbage collection, at least one free block having a lower erase count may be used first.

Figure 12A:
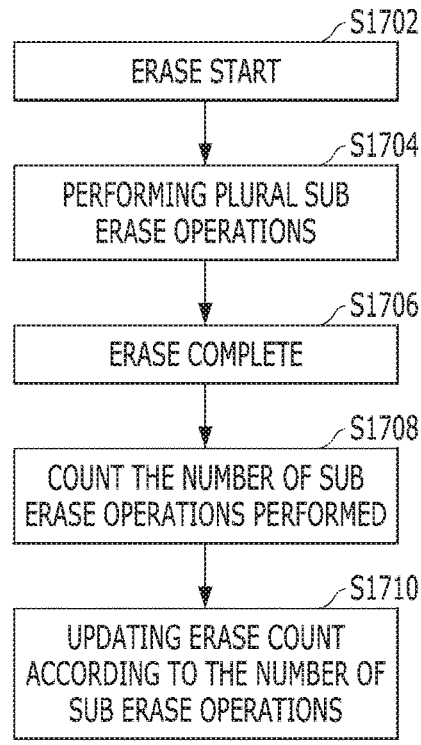
FIGS. 12A and 12B are flowcharts illustrating an erase operation and a count update operation in accordance with an embodiment of the disclosure.
Figure 12B:
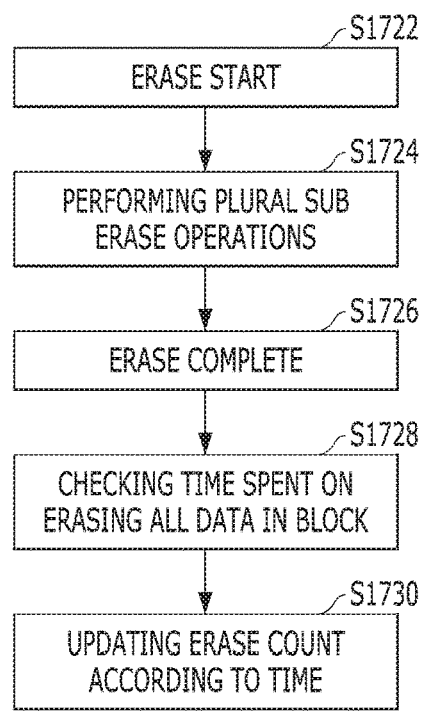

FIGS. 12A and 12B are flowcharts illustrating an operation method for an erase operation and an erase count update in accordance with an embodiment of the disclosure. The operation method of FIGS. 12A and 12B may be performed by the memory system 1002 including the controller 1004 and the memory device 1006 in FIG. 6.

Referring to FIG. 12A, the method for the erase operation and the erase count update includes starting an erase (S1702), performing a plurality of sub erase operations (S1704), completing the erase (S1706), checking (or counting) the number of sub erase operations (S1708), and updating an erase count according to predetermined ranges (S1710).

In the method of FIG. 12A, the controller 1004 may count the number of sub erase operations that are performed during the erase operation after the erase operation is completed, and variably increase an erase count regarding the block where the erase operation is performed according to which predetermined range the number of sub erase operation falls into.

At the step S1702, the controller 1004 may generate an instruction to search a target block in the memory device 1006 for performing the erase operation.

At the step S1704, the controller 1004 may perform an erase operation on the target block in the memory device 1006. The erase operation may include a plurality of sub erase operations, each corresponding to each of plural erase pulses. In the erase operation, the controller 1004 may erase all data in the target block step-by-step in response to the plural erase pulses. After a single sub erase operation is performed during the erase operation, the controller 1004 may generate a pulse to verify whether all the data in the target block are erased by the sub erase operation. When all data in the target block are erased, the erase operation is completed. Otherwise, another sub erase operation in response to an erase pulse having a voltage of same level with or higher level than that of the erase pulse may be performed. Through repeatedly performing sub erase operations, the controller 1004 may erase all data in the target block. A detailed description regarding the erase operation can be found in FIG. 13. When all data in the target block are erased at the step S1704, the erase operation may be completed (S1706).

At the step S1708, the controller 1004 checks (or counts) the total number of sub erase operations generated and performed at the steps S1702, S1704, S1706. That is, the number of sub erase operations is counted from a start of the first sub erase operation to a time point when all data of the target block is erased. The timing at which all data of the target block is erased may be substantially identical to a timing at which the sub erase operation using a voltage of the last erase stage is completed or the erase operation is completed.

At the step S1710, the controller 1004 may update the erase count based on the number of the sub erase operations checked at the step S1708. For example, the controller 1004 may add a first value x into the erase count when the number of sub erase operations is in a predetermined range. The controller 1004 may increase a second value less than the first value x when the number of sub erase operations is less than the predetermined range. Further, the controller 1004 may increase the erase count by a third value greater than the first value x when the number of sub erase operations is greater than the predetermined range. It is possible that the controller 1004 may variably increase an erase count of the target block depending on how many sub erase operations have been performed during a single erase operation, rather than increasing the erase count by a predetermined fixed value through the single erase operation.

When all data are already erased before any sub erase operation is performed or the erase operation corresponding to an erase command is not performed, the erase count may not be increased.

In accordance with an embodiment, the erase time may be estimated based at least on the number of sub erase operations checked at the step S1708. The sub erase operation may correspond to each erase pulse set in advance, and an operation margin for each sub erase operation performed once, is set. Therefore, the erase time may be calculated or estimated by multiplying the number of sub erase operations by the operation margin, i.e., the time consumed for the sub erase operation. For example, the time allowed for one sub erase operation is 1 second, and the sub erase operation is repeatedly performed 100 times for a single erase operation. In this case, the erase time for the single erase operation may be estimated to be 100 seconds.

Referring to FIG. 12B, the method for the erase operation and the erase count update includes starting an erase (S1722), performing a plurality of sub erase operations (S1724), completing the erase (S1726), checking a time spent on erasing all data in a target block (S1728), and updating an erase count of the target block according to the time (S1730).

The operation method of FIG. 12B measures the time consumed for the erase operation after the controller 1004 completes the erase operation, and variably increases the erase count according to whether the time is longer than or shorter than a predetermined range.

At the step S1722, the controller 1004 may generate an instruction to search a target block in the memory device 1006, which requires an erase operation for programming new data.

At the step S1724, the controller 1004 may perform an erase operation on the target block in the memory device 1006. The erase operation may include a plurality of sub erase operations, each corresponding to each of plural erase pulses. In the erase operation, the controller 1004 may erase all data in the target block stepwise in response to the plural erase pulses. After every sub erase operation is performed during the erase operation, the controller 1004 may generate a pulse to verify that all data in the target block are erased through each sub erase operation. If all data in the target block are erased, the erase operation is terminated. Otherwise, another sub erase operation using an erase pulse having a voltage of the same level or higher level, as compared with that of the current step, may be performed. By repeating the above procedure, the controller 1004 may delete all data in the target block. A detailed description of the erase operation may be found in FIG. 13. When all data in the target block are erased during the step S1724, the erase operation is completed (S1726).

At the step S1728, the controller 1004 may monitor, measure or estimate a total time consumed for the erase operation through the steps S1722, S1724, S1726. That is, the time may be monitored, measured, or estimated from the start of the first sub erase operation to a time point when all data of the target block is erased. In an embodiment, the timing at which all data of the target block is erased may be substantially identical to a timing at which the sub erase operation using a voltage of the last erase stage is completed or the erase operation is completed.

At the step S1730, the controller 1004 may update the erase count based on the erase time monitored, measured, or estimated at the step S1728. For example, the controller 1004 may add a fourth value y into the erase count when the erase time is in a predetermined range. The controller 1004 may increase a fifth value less than the fourth value y when the erase time is less than the predetermined range. Further, the controller 1004 may increase the erase count by a sixth value greater than the fourth value y when the erase time is greater than the predetermined range. It is possible to variably increase the erase count based on the time taken for erasing all data in one erase operation, instead of increasing the erase count by a predetermined fixed value assigned to each erase operation.

When a block in which all data has already been erased before any sub erase operation is performed or the erase operation corresponding to an erase command is not performed, the erase count may be not increased.

Figure 13:
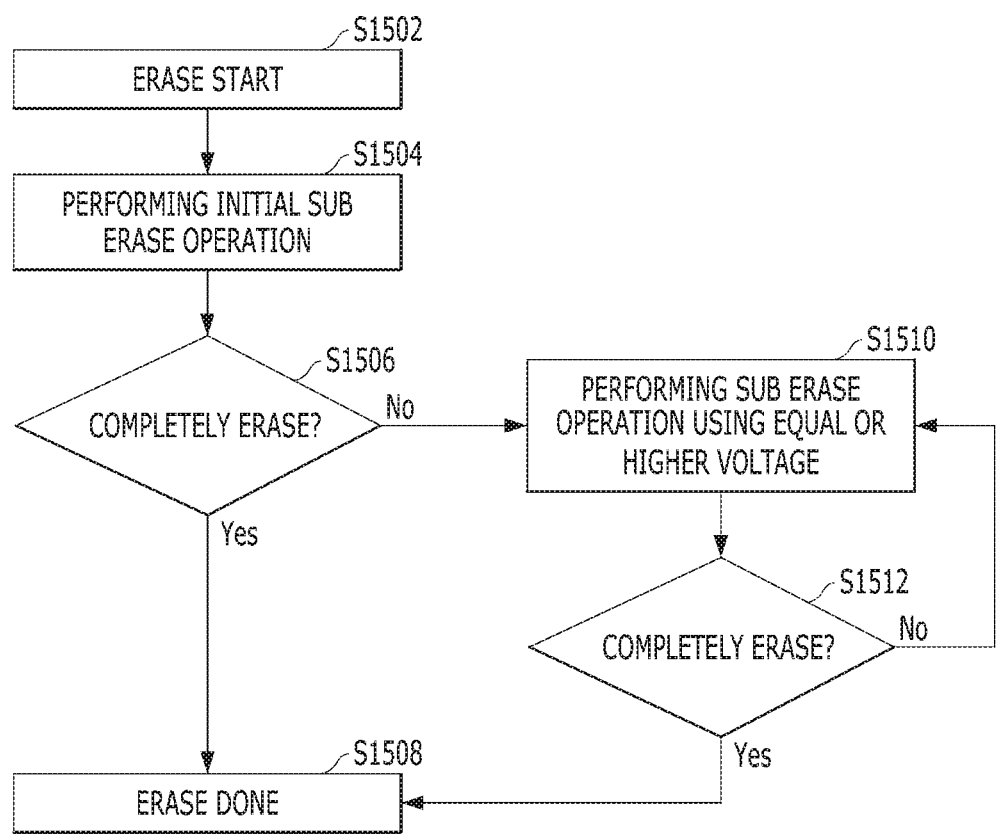
FIG. 13 is a flowchart illustrating an erase operation in accordance with an embodiment of the disclosure.

FIG. 13 is a flowchart illustrating an erase operation in accordance with an embodiment of the disclosure. The operation of FIG. 13 may be performed by the memory system 1002 including the controller 1004 and the memory device 1006 in FIG. 6.

Referring to FIG. 13, the erase operation may include starting an erase (S1502), performing an initial sub erase operation on a target block (S1504), verifying whether all data in the target block is erased completely (S1506), terminating an erase operation for the target block (S1508), performing another sub erase operation using an erase pulse having a voltage of the same level or higher level than the current level (S1510), and verifying whether all data is erased completely through the another sub erase operation (S1512).

In FIG. 13, a flowchart describes the erasing operation in detail. At the step S1502, the controller 1004 may generate an instruction to search the target block for the erase operation in the memory device 1006.

At the step S1504, in response to an erase command, the controller 1004 may perform an initial sub erase operation on the target block which is selected for the erase operation within the memory device 1006. The sub erase operation may include generating an erase pulse having a voltage level of a predetermined range. All data in the target block may be erased in response to the erase pulse. The sub erase operation may also include generating a pulse verifying an erase result after the erase pulse is generated. Through the pulse for verifying the erase result, the controller 1004 may check whether all data in the target block are erased in response to the erase pulse.

At the step S1506, it may be determined whether all data is erased by the initial sub erase operation performed at the step S1504. That is, it is possible to determine whether the erase operation is completed by the pulse for verifying the erase result. When all data is erased through the initial sub erase operation, the erase operation may be completed (S1508). Otherwise, another sub erase operation using an erase pulse having a voltage level which is equal to or higher than the current level is performed (S1510). Here, a voltage level of the erase pulse used for the sub erase operation may be determined depending on configuration of the memory system 1002.

At the step S1510, the controller 1004 may generate an erase pulse having the same or higher voltage level as compared with that of the erase pulse used for the preceding sub erase operation. All data in the target block may be erased corresponding to plural erase pulses having different levels. The sub erase operation performed at the step 1510 may use an erase pulse greater than the erase pulse used in the previous sub erase operation. Further, the sub erase operation performed at the step 1510 may use an erase pulse having the same voltage level with the erase pulse of the sub erase operation that was performed immediately before. The controller 1004 may generate a pulse for verifying an erase result immediately after the erase pulse is generated at the step S1510. The pulse for verifying the erase result may be used to check whether all data in the target block are erased in response to the erase pulse.

At the step 1512, it may be checked whether all data are erased by at least one sub erase operation performed at the step S1510. That is, it is possible to determine whether the erase operation is completed by the pulse for verifying an erase result. When it is determined that all data are erased through the sub erase operation, the erase operation is completed (S1508). Otherwise, the sub erase operation using an erase pulse having a voltage of the same level as the current level or a higher level greater than the current level may be performed (S1510).

Figure 14:
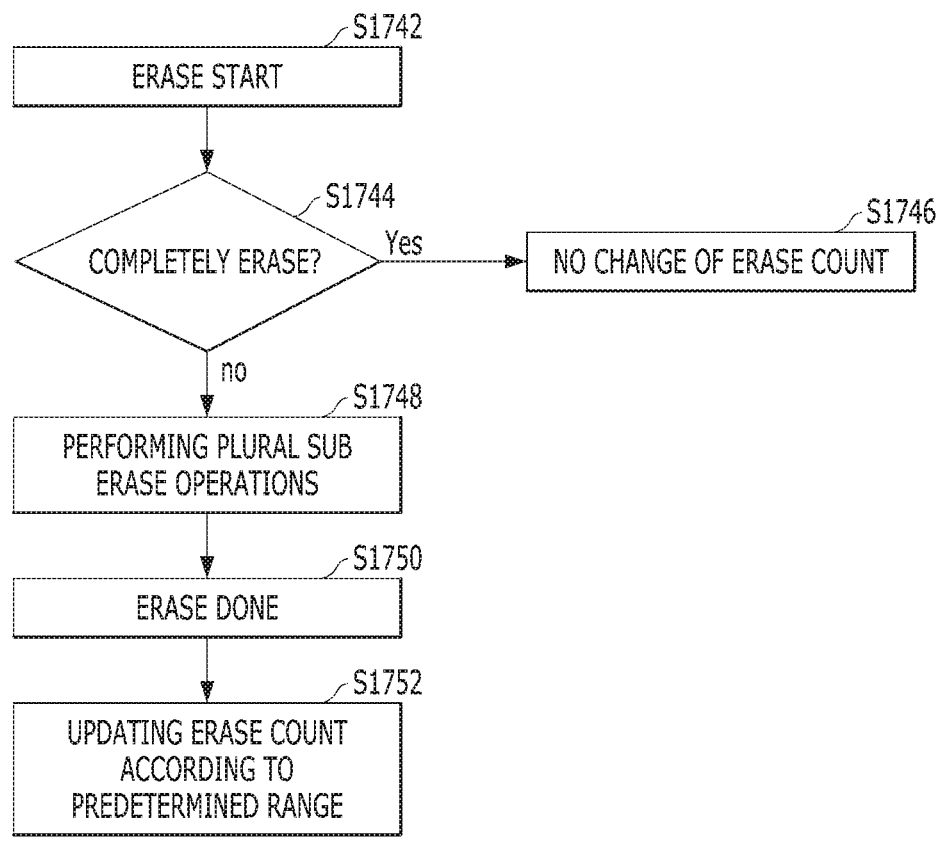
FIG. 14 is a flowchart illustrating a pre-sensing operation with an erase operation and a count update operation in accordance with an embodiment of the disclosure.

FIG. 14 is a flowchart illustrating a method including an erase operation, an erase count update, and a pre-sensing operation in accordance with an embodiment of the disclosure. The method of FIG. 14 may be performed by the memory system 1002 including the controller 1004 and the memory device 1006 in FIG. 6.

Referring to FIG. 14, the method may include starting an erase (S1742), performing a pre-sensing for checking whether all data in a target block are deleted (S1744), determining no change of erase count (S1746), performing a plurality of sub erase operations (S1748), completing the erase (S1750), and updating an erase count according to a predetermined range (S1752).

In FIG. 14, the method may be different from those in accordance with the embodiments described in FIGS. 12A and 12B in that the controller 1004 first checks whether all data are erased through the pre-sensing operation before an erase pulse used for the sub erase operation is generated and supplied into the target block. The controller 1004 may variably increase the erase count in response to information which may be obtained during the erase operation after the erase operation is completed. Here, the information may include the number of sub erase operations or an erase time consumed for the erase operation.

The pre-sensing is performed before the sub erase operation for the target is performed by the controller 1004. The pre-sensing may check in advance whether at least one erase pulse should be generated and supplied into a predetermined block for the erase operation. Alternatively, it is possible to determine whether all data of the target block are erased before any sub erase operation is performed.

The pre-sensing may be performed randomly or periodically by the controller 1004 regardless of the erase command, or be performed in response to the erase command. In FIG. 14, the pre-sensing is performed after the erase command is generated.

At the step S1742, the controller 1004 may generate an instruction to perform the pre-sensing to the target block. At the step S1744, when the controller 1004 recognizes a result of the pre-sensing and all data of the target block are erased, the erase count is not increased because the sub erase operation is not performed (S1746). Otherwise, a plurality of sub erase operations is performed to the target block, which are generated in response to the erase command for the controller 1004 to search the target block in the memory device 1006 for the erase operation (S1748).

At the step S1748, the controller 1004 performs an erase operation on the target block. A detailed description of the erase operation may be found in FIG. 13. When it is determined that all data in the target block are erased, the erase operation is terminated (S1750).

At the step S1752, the controller 1004 may variably increase the erase count based on the information obtained at the step S1748. Here, the obtained information may include the number of sub erase operations performed at the step S1748 or a time spent on sub erase operations performed at the step S1748.

At the step S1752, the controller 1004 may check a total number of sub erase operations performed at the step S1748. The controller 1004 may variably increase an erase count of a target block by comparing the number of sub erase operations with a predetermined range. FIG. 12A shows a detailed description regarding an operation for updating the erase count of the target block according to the number of sub erase operations and the predetermined range.

At the step S1752, the controller 1004 may monitor, measure, or estimate a total time of the erase operation performed at the step S1748. The controller 1004 may variably increase an erase count of a target based on a result of comparing the erase time with a predetermined time range. FIG. 12B shows a detailed description regarding an operation for updating the erase count regarding the target block based on the erase time and the predetermined range.

When it is determined that an erase operation to a target block is previously performed, the controller 1004 may perform a pre-sensing to check whether all data is erased and determine a necessity of the erase operation for programming new data. At the step of verifying a result of the pre-sensing (S1744), the sub erase operation using an erase pulse may be not performed and a time consumed for the pre-sensing may be shorter than that of other sub erase operations.

Figure 15:
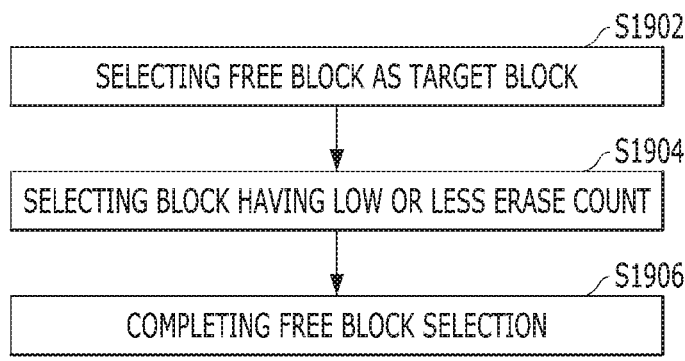
FIG. 15 is a flowchart illustrating an operation for selecting a free block in accordance with an embodiment of the disclosure.

FIG. 15 is a flowchart illustrating an operation of selecting a free block in accordance with an embodiment of the disclosure. The operation of FIG. 15 may be performed by the memory system 1002 including the controller 1004 and the memory device 1006 in FIG. 6.

Referring to FIG. 15, the procedure of selecting a free block includes selecting at least one free block F as a target block, among blocks including at least one free block F and at least one non-free block N (S1902), selecting a free block having low or less erase count among the at least one selected free block (S1904), and completing free block selection for another operation (S1906).

The controller 1004 may perform the procedure of selecting a free block to store data in the free block in response to a program command received from a host (e.g., the host 102 of FIG. 2). Alternatively, the process may be performed in which the controller 1004 selects a free block in advance before a program command is entered from the host.

At the step S1902, at least one free block F other than a non-free block N may be selected. The free block F may include a block in which data is not stored in all of the pages of the block after the erase operation is completed. The non-free block N may include an open block and a closed block. At the step S1902, the controller 1004 may select a free block F only among the blocks in the memory device 1006.

At the step S1904, the controller 1004 may preferentially select a free block having a low or less erase count from among free blocks selected at the step S1902. In accordance with an embodiment, the controller 1004 may select a free block with the lowest erase count value. In accordance with another embodiment, the controller 1004 may group free blocks based on erase counts of the free blocks, and then select one of free block groups having lowererase counts or lower average of erase counts. In accordance with another embodiment, the controller 1004 may list plural free blocks in an order (e.g., ascending order) of erase count.

At the step S1906, when it is determined that the number of free blocks may be sufficiently secured for the controller 1004 to perform a program operation, the free block selection may be completed.

For example, at the step S1902, among the blocks described in the third table TB_C in FIG. 10, the first block BLK1, the third block BLK3, and the n-th block BLKn may be selected. At the step S1904, among the blocks described in the third table TB_C, the n-th block BLKn, which is the free block and has the lowest erase count, may be preferentially selected based on a comparison result with other free blocks.

Figure 16:
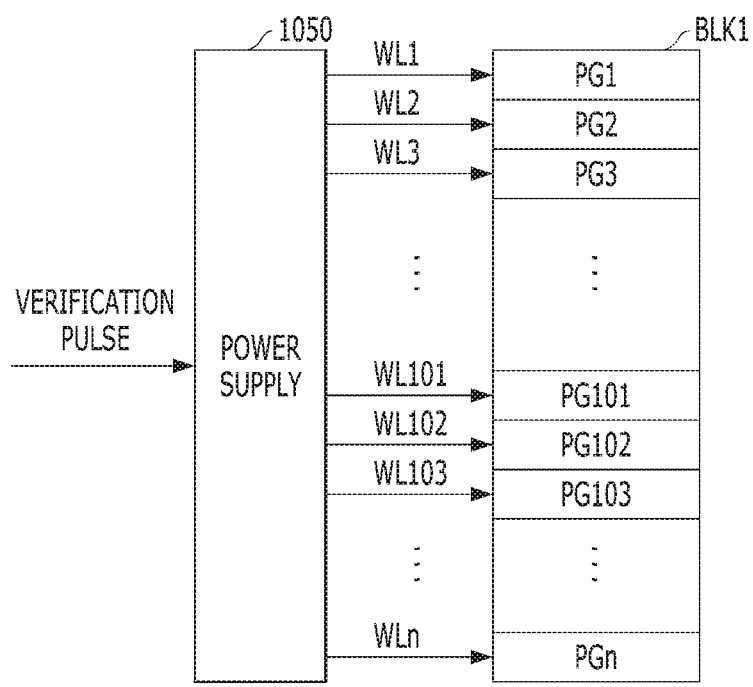
FIG. 16 is a diagram illustrating an operation for verifying an erase operation in accordance with an embodiment of the disclosure.

FIG. 16 illustrates an operation of a pulse for verifying whether all data in a target block is erased in accordance with an embodiment of the disclosure. The operation of FIG. 16 may be performed by the memory system 1002 including the controller 1004 and the memory device 1006 in FIG. 6.

Referring to FIG. 16, at least one pulse for verifying an erase result included in a sub erase operation is described. Although not shown, a power supply 1050 and a first block BLK1 may be included in the memory device 1006.

The power supply 1050 may receive an instruction associated with a pulse for verifying an erase result during the sub erase operation or checking an erase status. Each of plural pages PG1 to PGn of the first block BLK1 is connected to the power supply 1050 via each of plural word lines WL1 to WLn. The power supply 1050 may supply the pulse into each of the pages PG1 to PGn of the first block BLK1 via each of the word lines WL1 to WLn. A plurality of memory cells to which the pulse is applied via each word line may output a current flowing between source/drain of each memory cell. All data stored in each page or the memory cells may be read sequentially. Here, n may be natural number of 104 or more.

Depending on whether all data is erased in the memory cells in the page, the current flowing between the source and the drain may be varied when the pulse is supplied from the power supply 1050 through the word line. Thus, it is possible to verify whether the memory cells in the page stores data. For example, when a current supplied between the source and the drain is outputted, no data is stored in the memory cell. When a current supplied between the source and the drain is not outputted, data may be stored in the memory cell.

In accordance with an embodiment, the power supply 1050 is connected to each of the plural word lines WL1 to WLn. In response to the pulse for verifying the erase result of the sub erase operation, the power supply 1050 may supply a voltage into each of the plural pages PG1 to PGn of the first block BLK1.

By way of example but not limitation, the controller 1004 may check existence or absence of data, or a data default value, in a first page PG1 supplied with a voltage via the first word line WL1 by the power supply 1050. Then, the controller 1004 may check data in a second page PG2 supplied with a voltage via the first word line WL1 by the power supply 1050. The controller 1004 may check data in a third page PG3 by using a voltage supplied via the first word line WL1 from the power supply 1050. Sequentially, the controller 1004 may check data in the 101st page PG101 supplied with a voltage supplied from the power supply 1050 through the 101st word line WL101. The controller 1004 may check data in the 102nd page PG102 by using a voltage supplied from the power supply 1050 via the 102nd word line WL102. Then, the controller 1004 may check data in the 103rd page PG103 supplied with a voltage via the 103th word line WL103 by the power supply 1050. The controller 1004 may verify data in the n-th page PGn by using a voltage supplied via the n-th word line WLn from the power supply 1050.

A pulse for verifying the erase result is used to ensure whether all data in a specific block are erased. A method for verifying whether all data in the block are erased may be implemented in various embodiments. For example, before a first sub erase operation is performed, the controller 1004 may select an arbitrary page in the block, check whether all data in the arbitrary page are erased, and sequentially verify data in a next page until finding any page whose data has not been erased. If the controller 1004 finds a page that has not been cleared of data, the controller 1004 may not need to check other pages anymore because all data of the block are not erased. In an embodiment, the previously verified pages which do not store any data may be not verified additionally in the current or following sub erase operation. In the following sub erase operation, the controller 1004 may sequentially perform a verification from the page where data previously remains in the first sub erase operation.

Figure 17:
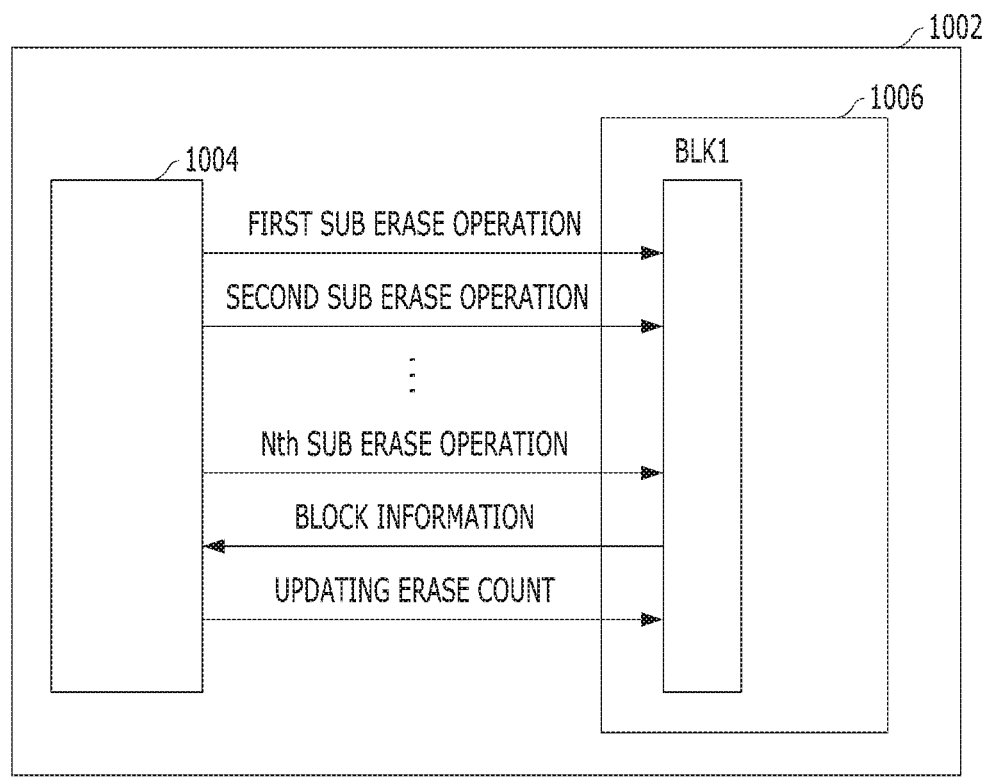
FIG. 17 is a block diagram illustrating plural sub erase operations in accordance with an embodiment of the disclosure.

FIG. 17 illustrates plural sub erase operations in accordance with an embodiment of the disclosure. As shown, the memory system 1002 may include a controller 1004 and a memory device 1006. The memory device 1006 may include a plurality of blocks capable of storing data.

Referring to FIG. 17, the controller 1004 performs a plurality of sub erase operations including a first sub erase operation, a second sub erase operation and an n-th sub erase operation) with a time interval until a target block is erased. The plurality of sub erase operations may include an operation in response to each of plural erase pulses supplied into the target block. Further, the plurality of sub erase operations may include an operation associated with a pulse for verifying an erase result after the erase pulse is generated. Herein, n may be a natural number greater than or equal to 3.

The controller 1004 may access and check block information regarding a predetermined block in the memory device 1006. More specifically, the block information may include an erase count of a block, and an identifier of whether the block is a free block. For example, after all of the data of the block is erased, the controller 1004 may check or change the erase count of the block.

The controller 1004 may erase all data of a specific block and update an erase count of the block. For example, the controller 1004 may access block information regarding the block after erasing all of the data of the block through at least one sub erase operation, and may variably increase the erase count of the block.

In an embodiment of the disclosure, the memory device 1006 may include a first block BLK1 which is required to be a free block through an erase operation. The controller 1004 may erase all data in the first block KU through at least one sub erase operations among a first sub erase operation, a second sub erase operation and an n-th sub erase operation.

The controller 1004 may perform a first sub erase operation on the first block BLK1. The first sub erase operation may include an operation in response to an erase pulse supplied into the first block BLK1. The first sub erase operation may also include another operation using a pulse for verifying an erase result immediately after the erase pulse is generated. For example, the controller 1004 may generate an erase pulse to erase all of the data of the first block BLK1 and check whether all of the data of the first block BLK1 is erased by the erase pulse.

When it is determined that all of the data of the first block BLK1 are not erased, in response to the pulse for verifying the erase result of the first sub erase operation, the controller 1004 outputs another erase pulse of an equal or higher voltage level as that of previous one. The second sub erase operation in response to another erase pulse may be performed. Similar to the first sub erase operation, the second sub erase operation may also include an operation in response to an erase pulse supplied into the first block BLK1 and another operation using a pulse for verifying an erase result immediately after the erase pulse is generated.

At least one sub erase operation may be performed until all of the data of the first block BLK1 are erased. The controller 1004 may perform the n-th sub erase operation to the same block, i.e., the first block BLK1. The n-th sub erase operation may also include an operation in response to an erase pulse supplied into the first block BLK1, and another operation using a pulse for verifying an erase result immediately after the erase pulse is generated.

When it is checked that all of the data in the first block BLK1 are erased corresponding to the pulse for verifying the erase result of any one of the first to the n-th sub erase operations, the controller 1004 may terminate the erase operation and does not perform the erase operation any more.

In accordance with an embodiment, the controller 1004 may check or change the block information after performing at least one sub erase operation among the first sub erase operation, the second sub erase operation and the nth sub erase operation. Further, the controller 1004 may determine whether the first block BLK1 is a free block, and recognize an erase count of the first block BLK1. In accordance with an embodiment, the controller 1004 may access the erase count which is the block information of the first block BLK1 after verifying that all of the data of the first block BLK1 are erased. In addition, the controller 1004 may variably increase the erase count of the first block BLK1 based on the total number of sub erase operations performed for the erase operation. That is, the controller 1004 adds a different value corresponding to the number of sub erase operations performed during the erase operation into the erase counts of the first block BLK1. Here, the erase operation has been performed from a timing of when the first sub erase operation starts to the end of the n-th sub erase operation, or until all of the data of the first block BLK1 are erased.

In accordance with another embodiment, when the controller 1004 fails to erase all of the data of the first block BLK1 during the erase operation, the controller 1004 may not access the erase count of the first block BLK1. In addition, the controller 1004 may not update the erase count of the first block BLK1, and determine the first block BLK1 as a bad block.

Figure 18:
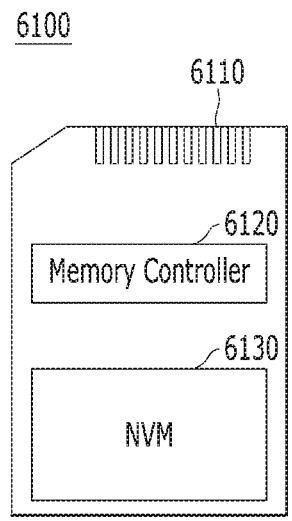
FIGS. 18 to 26 are diagram illustrating data processing systems including a memory system in accordance with embodiments of the invention.

In FIG. 18, another example of the data processing system including the memory system in accordance with an embodiment is described. For example, FIG. 18 schematically illustrates a memory card system 6100 to which the memory system is applied.

Referring to FIG. 18, the memory card system 6100 may include a memory controller 6120, a memory device 6130 and a connector 6110.

The memory controller 6120 may be connected to the memory device 6130 embodied by a nonvolatile memory. The memory controller 6120 may be configured to access the memory device 6130. By way of example and not limitation, the memory controller 6120 may be configured to control read, write, erase, and background operations of the memory device 6130. The memory controller 6120 may be configured to provide an interface between the memory device 6130 and a host, and use firmware for controlling the memory device 6130. That is, the memory controller 6120 may correspond to the controller 130 of the memory system 110 described with reference to FIG. 2, and the memory device 6130 may correspond to the memory device 150 of the memory system 110 described with reference to FIG. 2.

Thus, the memory controller 6120 may include a RAM, a processor, a host interface, a memory interface, and an error correction component. The memory controller 130 may further include the elements shown in FIG. 2.

The memory controller 6120 may communicate with an external device, for example, the host 102 of FIG. 2 through the connector 6110. For example, as described with reference to FIG. 2, the memory controller 6120 may be configured to communicate with an external device according to one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system may be applied to wired/wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 2.

The memory controller 6120 and the memory device 6130 may be integrated into a single semiconductor device. For example, the memory controller 6120 and the memory device 6130 may be integrated to form a solid state drive (SSD). In another embodiment, the memory controller 6120 and the memory device 6130 may be integrated to form a memory card such as a PC card (e.g., Personal Computer Memory Card International Association (PCMCIA) card), a compact flash (CF) card, a smart media card (e.g., a SM and a SMC), a memory stick, a multimedia card (e.g., a MMC, a RS-MMC, a MMCmicro and an eMMC), a secure digital (SD) card (e.g., a SD, a miniSD, a microSD and a SDHC) and/or a universal flash storage (UFS).

Figure 19:
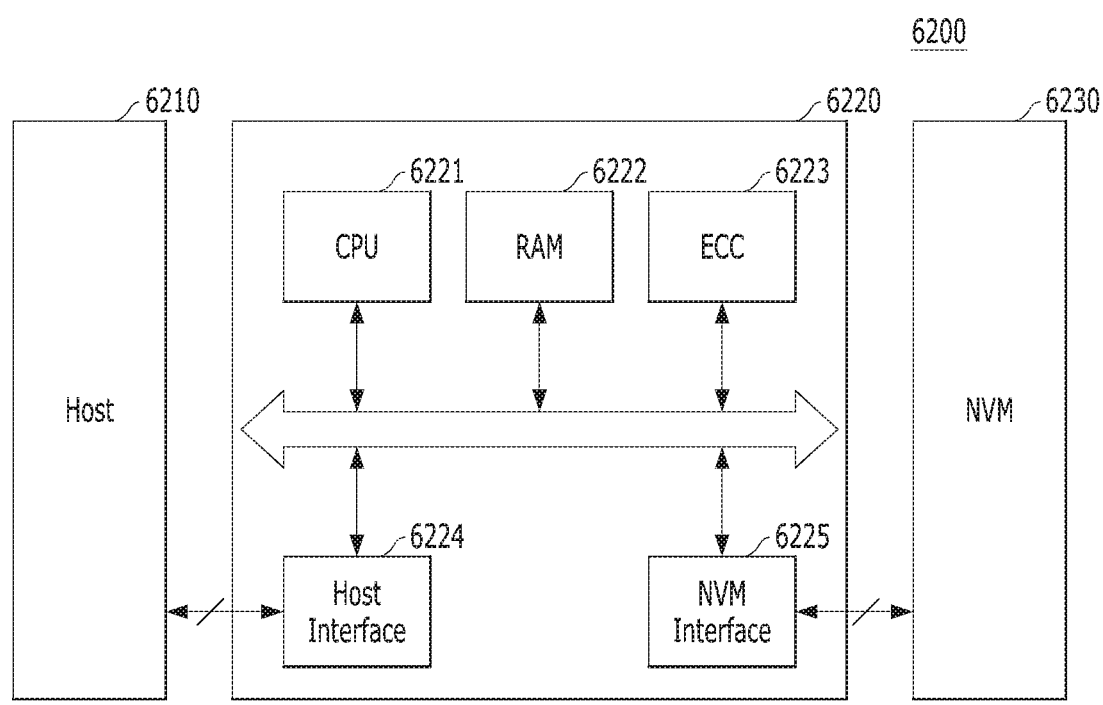

FIG. 19 is a diagram schematically illustrating a data processing system 6200 including the memory system in accordance with an embodiment.

Referring to FIG. 19, the data processing system 6200 may include a memory device 6230 having one or more nonvolatile memories (NVMs) and a memory controller 6220 for controlling the memory device 6230. The data processing system 6200 may serve as a storage medium such as a memory card (CF, SD, micro-SD or the like) or USB device, as described with reference to FIG. 2. The memory device 6230 may correspond to the memory device 150 in the memory system 110 illustrated in FIG. 2. The memory controller 6220 may correspond to the controller 130 in the memory system 110 illustrated in FIG. 2.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management, and bad page management operations. The RAM 6222 may be operated according to control of the CPU 6221. The RAM 6222 may be used as a work memory, buffer memory, or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC component 138 of the controller 130 illustrated in FIG. 2. As described with reference to FIG. 2, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 2, the ECC circuit 6223 may correct an error using the LDPC code, BCH code, turbo code, Reed-Solomon code, convolution code, RSC or coded modulation such as TCM or BCM.

The memory controller 6220 may exchange data with the host 6210 through the host interface 6224. The memory controller 6220 may exchange data with the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then exchange data with the external device. Particularly, as the memory controller 6220 is configured to communicate with the external device through one or more of various communication protocols, the memory system and the data processing system in accordance with an embodiment may be applied to wired/wireless electronic devices, particularly a mobile electronic device.

Figure 20:
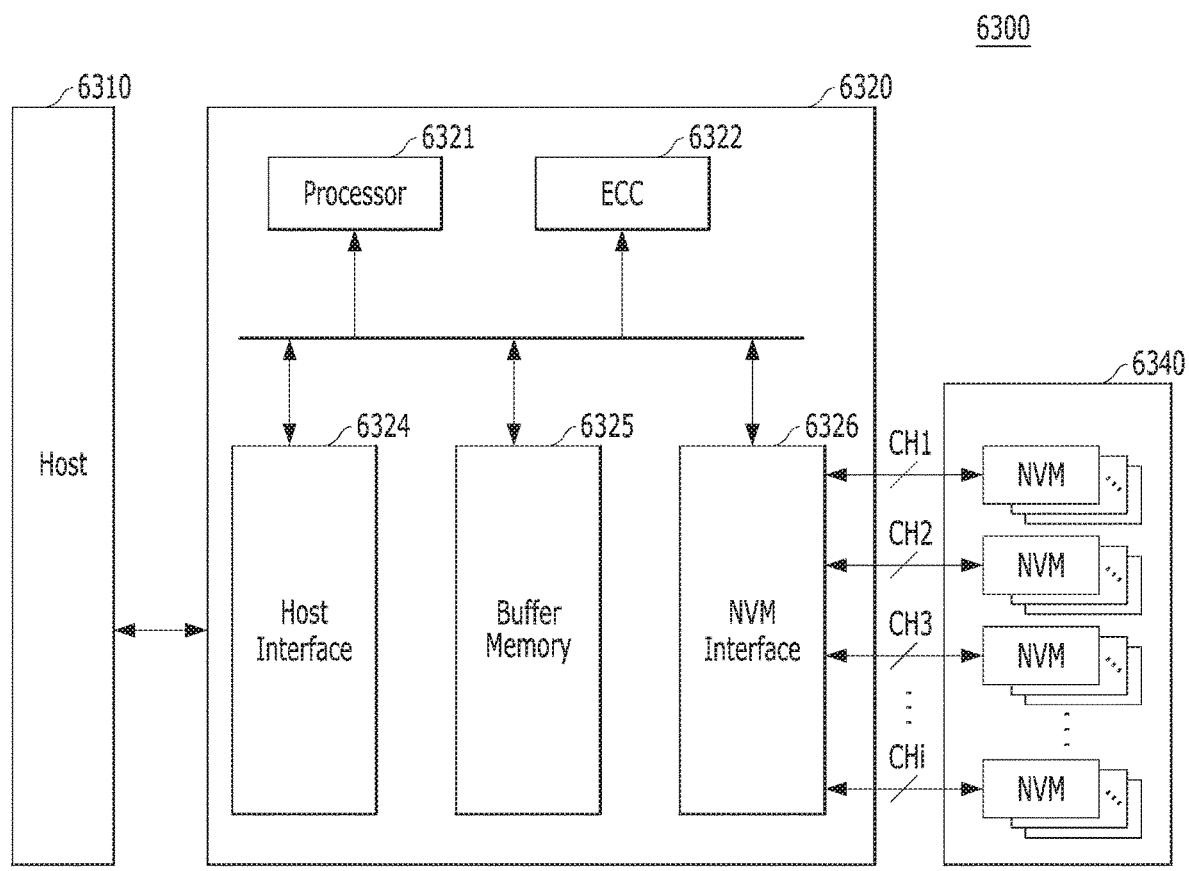

FIG. 20 is a diagram schematically illustrating another example of the data processing system including the memory system in accordance with an embodiment. For example, FIG. 20 schematically illustrates a solid state drive (SSD) 6300 to which the memory system is applied.

Referring to FIG. 20, the SSD 6300 may include a controller 6320 and a memory device 6340 including a plurality of nonvolatile memories. The controller 6320 may correspond to the controller 130 in the memory system 110 of FIG. 2. The memory device 6340 may correspond to the memory device 150 in the memory system of FIG. 2.

Specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by any of various volatile memories such as DRAM, SDRAM, DDR SDRAM, LPDDR SDRAM and GRAM or nonvolatile memories such as FRAM, ReRAM, STT-MRAM and PRAM. FIG. 20 illustrates that the buffer memory 6325 is disposed in the controller 6320. However, the buffer memory 6325 may be disposed externally to the controller 6320.

The ECC circuit 6322 may calculate an ECC value of data to be programmed to the memory device 6340 during a program operation. The ECC circuit 6322 may perform an error correction operation on data read from the memory device 6340 based on the ECC value during a read operation. The ECC circuit 6322 may perform an error correction operation on data recovered from the memory device 6340 during a faded data recovery operation.

The host interface 6324 may provide an interface function with an external device, for example, the host 6310. The nonvolatile memory interface 6326 may provide an interface function with the memory device 6340 connected through the plurality of channels.

Furthermore, a plurality of SSDs 6300 to which the memory system 110 of FIG. 2 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300. The RAID controller may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300. The RAID controller may provide data read from the selected SSDs 6300 to the host 6310.

Figure 21:
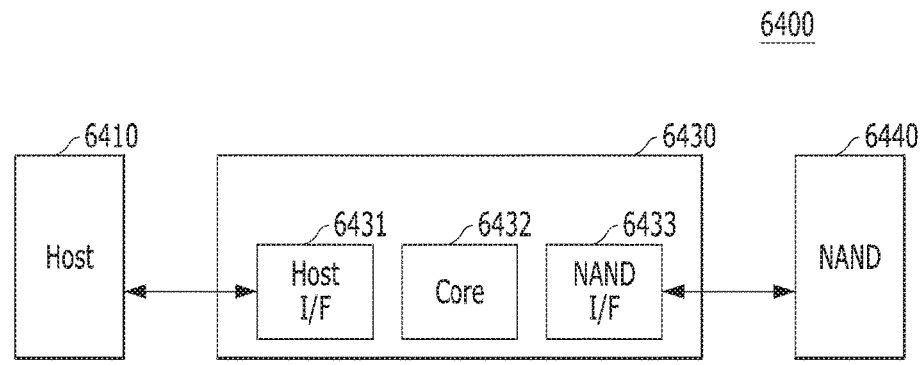

FIG. 21 is a diagram schematically illustrating another example of the data processing system including the memory system in accordance with an embodiment. For example, FIG. 21 schematically illustrates an embedded Mufti-Media Card (eMMC) 6400 to which the memory system is applied.

Referring to FIG. 21, the eMMC 6400 may include a controller 6430 and a memory device 6440 embodied by one or more NAND flash memories. The controller 6430 may correspond to the controller 130 in the memory system 110 of FIG. 2. The memory device 6440 may correspond to the memory device 150 in the memory system 110 of FIG. 2.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400. The host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 2. Furthermore, the host interface 6431 may serve as a serial interface, for example, UHS ((Ultra High Speed)-I/UHS-II) interface.

FIGS. 17 to 20 are diagrams schematically illustrating other examples of the data processing system including the memory system in accordance with embodiments. For example, FIGS. 17 to 20 schematically illustrate universal flash storage (UFS) systems 6500, 6600, 6700, 6800 to which the memory system is applied.

Referring to FIGS. 17 to 20, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices, particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices, particularly mobile electronic devices through UFS protocols, and the UFS devices 6520, 6620, 6720, 6820 and the UFS cards 6530, 6630, 6730, 6830 may be embodied by the memory system 110 illustrated in FIG. 2. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 19 to 21, and the UFS cards 6530, 6630, 6730, 6830 may be embodied in the form of the memory card system 6100 described with reference to FIG. 18.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface).

Furthermore, the UFS devices 6520, 6620, 6720, 6820 and the UFS cards 6530, 6630, 6730, 6830 may communicate with each other through various protocols other than the UFS protocol, for example, an UFDs, a MMC, a SD, a mini-SD, and a micro-SD.

Figure 22:
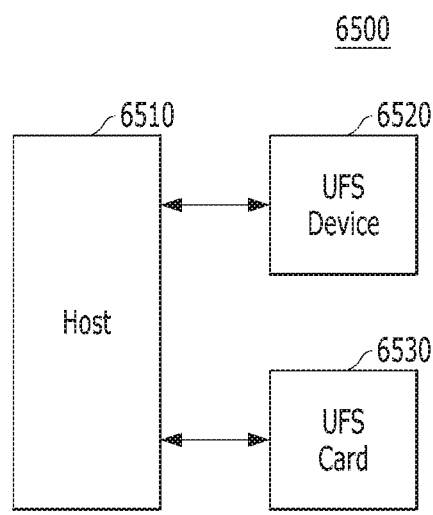

In the UFS system 6500 illustrated in FIG. 22, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the embodiment of FIG. 22, the configuration in which one UFS device 6520 and one UFS card 6530 are connected to the host 6510 is illustrated by way of example. However, in another embodiment, a plurality of UFS devices and UFS cards may be connected in parallel or in the form of a star to the host 6410. The form of a star is an arrangement where a single centralized component is coupled to plural devices for parallel processing. A plurality of UFS cards may be connected in parallel or in the form of a star to the UFS device 6520 or connected in series or in the form of a chain to the UFS device 6520.

Figure 23:
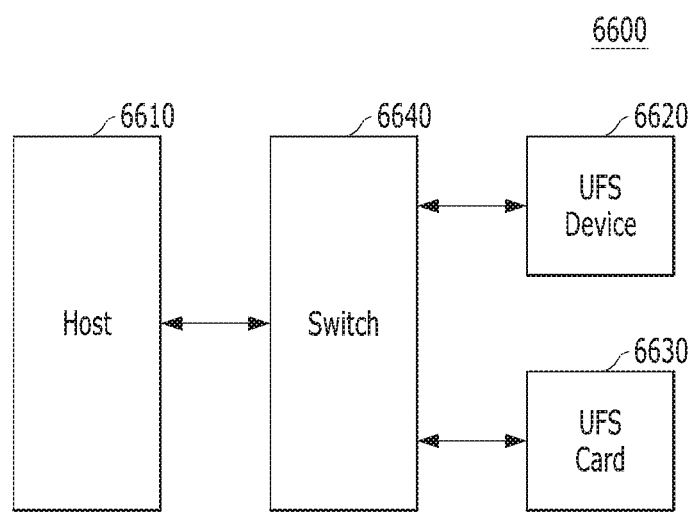

In the UFS system 6600 illustrated in FIG. 23, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the embodiment of FIG. 23, the configuration in which one UFS device 6620 and one UFS card 6630 are connected to the switching module 6640 is illustrated by way of example. However, in another embodiment, a plurality of UFS devices and UFS cards may be connected in parallel or in the form of a star to the switching module 6640, and a plurality of UFS cards may be connected in series or in the form of a chain to the UFS device 6620.

Figure 24:
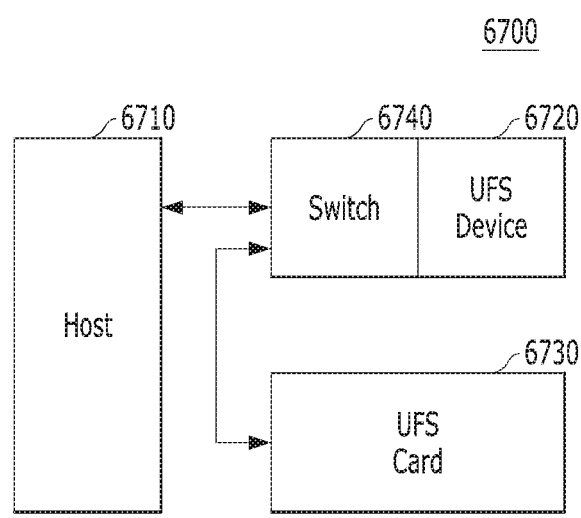

In the UFS system 6700 illustrated in FIG. 24, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the embodiment of FIG. 24, the configuration in which one UFS device 6720 and one UFS card 6730 are connected to the switching module 6740 is illustrated by way of example. However, in another embodiment, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 25:
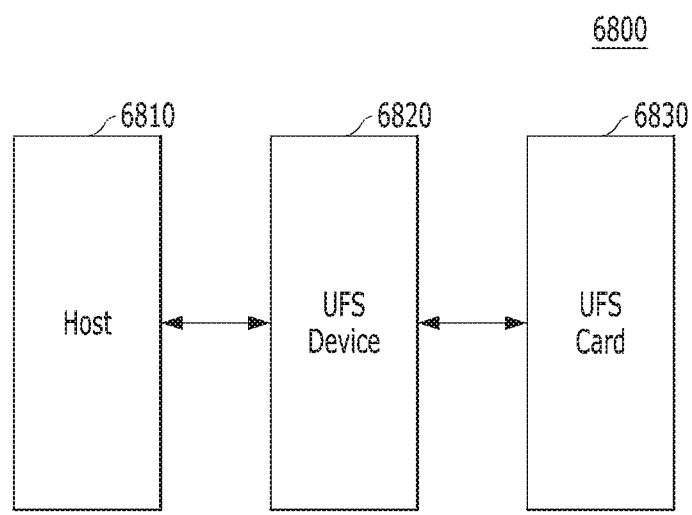

In the UFS system 6800 illustrated in FIG. 25, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY, and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the embodiment of FIG. 25, the configuration in which one UFS device 6820 is connected to the host 6810 and one UFS card 6830 is connected to the UFS device 6820 is illustrated by way of example. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 26:
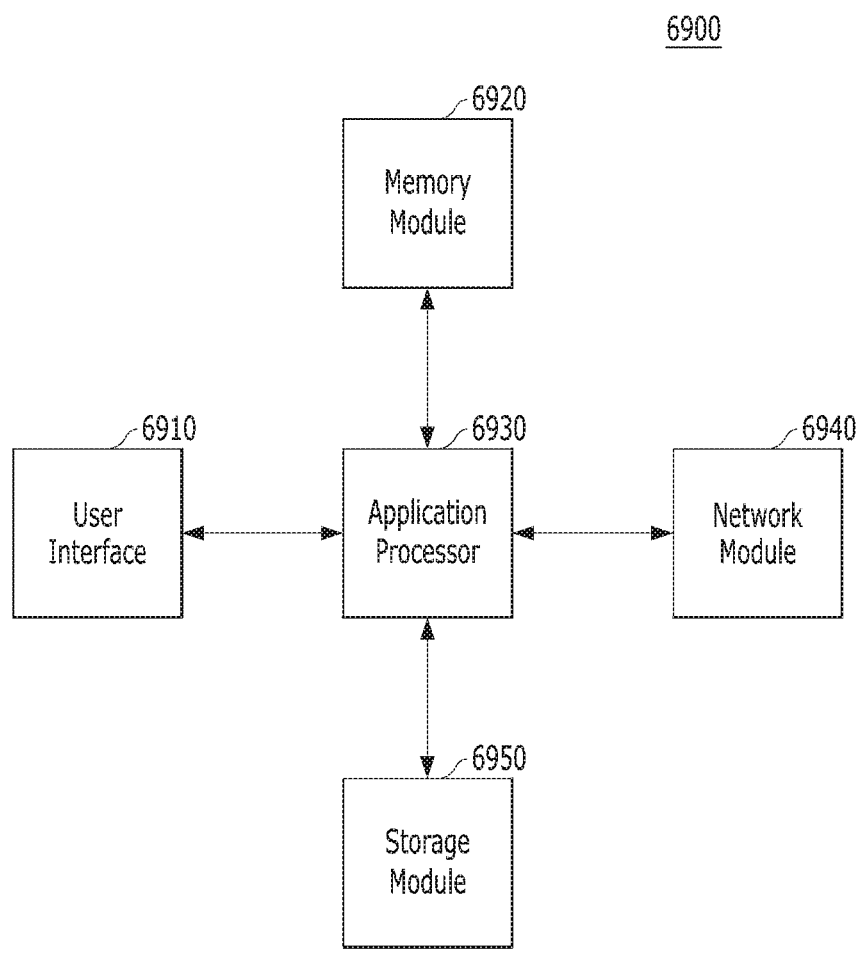

FIG. 26 is a diagram schematically illustrating another example of the data processing system including the memory system in accordance with an embodiment of the disclosure. For example, FIG. 26 is a diagram schematically illustrating a user system 6900 to which the memory system is applied.

Referring to FIG. 26, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory, or cache memory of the user system 6900. The memory module 6920 may include a volatile RAM such as DRAM, SDRAM, DDR SDRAM, DDR2 SDRAM, DDR3 SDRAM, LPDDR SDARM, LPDDR2 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the disclosure, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 2. Furthermore, the storage module 6950 may be embodied as an SSD, an eMMC and an UFS as described above with reference to FIGS. 18 to 25.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 5 is applied to a mobile electronic device of the user system 6900, the application processor 6930 may control overall operations of the mobile electronic device. The network module 6940 may serve as a communication module for controlling wired/wireless communication with an external device. The user interface 6910 may display data processed by the processor 6930 on a display/touch module of the mobile electronic device. Further, the user interface 6910 may support a function of receiving data from the touch panel.

As described above, in an embodiment of the disclosure, a memory system, a data processing system, and a method of verifying an operation method and an operation thereof may be configured such that an erase count variably incremented after a deletion operation or an erase operation is performed is determined based on an operational status of each block, thereby improving the operational safety of the memory system.

The disclosure also provides embodiments for allocating plural blocks of a memory system capable of storing a large amount of data, which can have different characteristics according to a manufacturing process or a type of data, based on a balance estimated by erase counts of the plural blocks, so that it is possible to perform operations such as wear leveling and garbage collection more efficiently and to improve the reliability of the memory system.

While the disclosure illustrates and describes specific embodiments, it will be apparent to those skilled in the art in light of the present disclosure that various changes and modifications may be made without departing from the spirit and scope of the invention as defined in the following claims.

What is claimed is:

1. A memory system, comprising:
    a memory device including a plurality of blocks; and
    a controller coupled with the memory device, and configured to perform at least one sub erase operation on each of the plurality of blocks, and variably increase an erase count of each of the plurality of blocks based on a timing of erasing data of each of the plurality of blocks through the sub erase operation, wherein the controller variably increases an erase count regarding a corresponding block based on a time interval between a first timing of beginning an initial sub erase operation and a second timing of completely erasing data of the corresponding block, and wherein the controller increases the erase count by one of:

a first value when the time interval is equal to a threshold;

a second value less than the first value when the time interval is less than the threshold; and a third value greater than the first value when the time interval is greater than the threshold.

2. The memory system according to claim 1, wherein the sub erase operation is associated with a plurality of erase pulses generated in response to an erase command, and the controller erases the data stored in the corresponding block based on at least one of the plurality of erase pulses.

3. The memory system according to claim 2, wherein the erase count regarding the corresponding block is further determined based on a number of sub erase operations performed after an initial sub erase operation is performed before the data of the corresponding block is erased.

4. The memory system according to claim 3, wherein the controller increases the erase count by one of:

a first value when the number of sub erase operations is equal to a threshold;

a second value less than the first value when the number of sub erase operations is less than the threshold; and a third value greater than the first value when the number of sub erase operations is greater than the threshold.

5. The memory system according to claim 2, wherein the controller verifies whether the data of the corresponding block is erased whenever each sub erase operation is done.

6. The memory system according to claim 2, wherein the controller verifies whether the data of the corresponding block is erased before the sub erase operation is initially performed.

7. The memory system according to claim 2, wherein the controller maintains the erase count of the corresponding block when no sub erase operation is performed in the corresponding block.

8. The memory system according to claim 1, wherein the controller allocates the corresponding block for another operation when the erase count of the corresponding block is less than that of other blocks among the plurality of blocks.

9. An apparatus for controlling a nonvolatile memory device including a plurality of blocks, the apparatus comprising:

an erase operation control circuitry for performing at least one sub erase operation on each of the plurality of blocks, and variably increasing an erase count of each of the plurality of blocks based on a timing of erasing data of each of the plurality of blocks through the sub erase operation; and a program control circuitry for allocating a block among the plurality of blocks for programming when the erase count of the block is less than that of other blocks among the plurality of blocks, wherein the controller variably increases an erase count regarding a corresponding block based on a time interval between a first timing of beginning an initial sub erase operation and a second timing of completely erasing data of the corresponding block, and wherein the controller increases the erase count by one of:

a first value when the time interval is equal to a threshold;

a second value less than the first value when the time interval is less than the threshold; and a third value greater than the first value when the time interval is greater than the threshold.

10. A method for operating a memory system, comprising:

performing at least one sub erase operation on each of the plurality of blocks;

determining whether data of each of the plurality of blocks is erased;

erasing data stored in a corresponding block based on the sub erase operation, each associated with a plurality of erase pulses generated in response to an erase command; and variably increasing an erase count of each of the plurality of blocks based on a timing of erasing data of each of the plurality of blocks through the sub erase operation, wherein the variably increasing of the erase count includes variably increasing the erase count regarding the corresponding block based on a time interval between a first timing of beginning an initial sub erase operation and a second timing of completely erasing the data of the corresponding block, wherein the erase count is increased by one of:

a first value when the time interval is equal to a threshold;

a second value less than the first value when the time interval is less than the threshold; and a third value greater than the first value when the time interval is greater than the threshold.

11. The method according to claim 10, wherein the erase count regarding the corresponding block is further determined based on a number of sub erase operations performed after an initial sub erase operation is performed before the data of the corresponding block is erased.

12. The method according to claim 11, wherein the erase count is increased by one of:

a first value when the number of sub erase operations is equal to a threshold;

a second value less than the first value when the number of sub erase operations is less than the threshold; and a third value greater than the first value when the number of sub erase operations is greater than the threshold.

13. The method according to claim 10, further comprising: verifying whether the data of the corresponding block is erased before the sub erase operation is initially performed.

14. The method according to claim 10, wherein the variably increasing of the erase count includes maintaining the erase count of the corresponding block when no sub erase operation is performed in the corresponding block.

15. The method according to claim 10, further comprising: allocating the corresponding block for another operation first when the erase count of the corresponding block is less than that of other blocks among the plurality of blocks.

* * * * *